(12) United States Patent
Lee et al.

(10) Patent No.: US 10,963,080 B2
(45) Date of Patent: Mar. 30, 2021

(54) DISPLAY DEVICE HAVING PRESSURE SENSORS ON SIDE EDGES

(71) Applicant: Samsung Display Co., Ltd., Yongin-si (KR)

(72) Inventors: Tae Hee Lee, Hwaseong-si (KR); Sung Kook Park, Suwon-si (KR); So Hee Park, Cheonan-si (KR); Hee Seomoon, Hwaseong-si (KR); Won Ki Hong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 16/273,070

(22) Filed: Feb. 11, 2019

(65) Prior Publication Data
US 2020/0042125 A1 Feb. 6, 2020

(30) Foreign Application Priority Data
Aug. 1, 2018 (KR) .......................... 10-2018-0089741

(51) Int. Cl.
| | | |
|---|---|---|
| *G06F 3/041* | (2006.01) | |
| *G06F 3/0488* | (2013.01) | |
| *H01L 27/32* | (2006.01) | |
| *H05K 1/18* | (2006.01) | |

(52) U.S. Cl.
CPC .......... *G06F 3/0412* (2013.01); *G06F 3/0414* (2013.01); *G06F 3/0488* (2013.01); *H01L 27/323* (2013.01); *H05K 1/189* (2013.01); *G06F 2203/04102* (2013.01); *H05K 2201/10128* (2013.01)

(58) Field of Classification Search
CPC ..................................................... G06F 3/0412
USPC .......................................................... 345/173
See application file for complete search history.

(56) References Cited

U.S. PATENT DOCUMENTS

| | | |
|---|---|---|
| 8,669,963 B2 | 3/2014 | Baker et al. |
| 9,454,253 B2 | 9/2016 | Kim et al. |
| 2010/0085317 A1* | 4/2010 | Park .................. G06F 3/016 345/173 |
| 2013/0155627 A1 | 6/2013 | Mareno et al. |
| 2014/0085213 A1 | 3/2014 | Huppi et al. |
| 2014/0092064 A1 | 4/2014 | Bernstein et al. |
| 2015/0324056 A1* | 11/2015 | Sato .................. G06F 3/0416 345/174 |

(Continued)

FOREIGN PATENT DOCUMENTS

| | | |
|---|---|---|
| JP | 2004-287640 | 10/2004 |
| KR | 10-2016-0015924 | 2/2016 |

(Continued)

*Primary Examiner* — Long D Pham
(74) *Attorney, Agent, or Firm* — H.C. Park & Associates, PLC

(57) ABSTRACT

A display device includes: a display panel; an input sensing panel; a display flexible circuit board to control the display panel having an input sensing driving circuit electrically connected to the input sensing panel, the display flexible circuit board being connected to the display panel; and a first pressure sensor disposed adjacent to and extending along a first edge of the display panel, wherein the first pressure sensor is electrically connected to the input sensing driving circuit of the display flexible circuit board.

23 Claims, 25 Drawing Sheets

(56) References Cited

U.S. PATENT DOCUMENTS

| | | | |
|---|---|---|---|
| 2015/0331451 A1* | 11/2015 | Shin | G06F 1/1637 |
| | | | 345/173 |
| 2016/0062517 A1 | 3/2016 | Meyer et al. | |
| 2017/0131811 A1* | 5/2017 | Watanabe | G06F 1/1643 |
| 2017/0287992 A1 | 10/2017 | Kwak et al. | |
| 2017/0336899 A1* | 11/2017 | Szeto | G06F 3/04142 |

FOREIGN PATENT DOCUMENTS

| | | |
|---|---|---|
| KR | 10-2017-0111827 | 10/2017 |
| KR | 10-2018-0013328 | 2/2018 |

* cited by examiner

DISPLAY DEVICE HAVING PRESSURE SENSORS ON SIDE EDGES

CROSS REFERENCE TO RELATED APPLICATION

This application claims priority from and the benefit of Korean Patent Application No. 10-2018-0089741, filed on Aug. 1, 2018, which is hereby incorporated by reference for all purposes as if fully set forth herein.

BACKGROUND

Field

Exemplary implementations of the invention relate generally to a display device and, more specifically, to a display device including pressure sensors.

Discussion of the Background

Electronic devices that present images to a user such as a smart phone, a tablet PC, a digital camera, a laptop computer, a navigation device and a smart TV include a display device for displaying images. Such a display device includes a display panel for generating and displaying an image and various input means.

Recently, a touch panel for recognizing a touch input has been widely employed for a display device of a smartphone or a tablet PC. By its convenience, a touch panel increasingly replaces existing physical input devices such as a keypad.

The above information disclosed in this Background section is only for understanding of the background of the inventive concepts, and, therefore, it may contain information that does not constitute prior art.

SUMMARY

Devices constructed according to exemplary implementations of the invention are capable of providing pressure sensors in a touch panel as a substitute for existing physical buttons of a display device. Particularly, display devices constructed according the principles and exemplary implementations of the invention include pressure sensors capable of receiving pressure input from a user without physical buttons.

For example, in exemplary implementations of the invention, one or more pressure sensors may be disposed along a long side edge of the display panel in or adjacent to the bezel region of the display, and may curved as necessary to correspond to the shape of the side edge or bezel.

In some exemplary embodiments, all the physical input buttons may be eliminated from the display device, and integrated pressure sensors may replace all of the physical input buttons. By doing so, the input means for receiving user inputs and the like are not exposed to the surface of the display device, thereby increasing the degree of design freedom and enhancing aesthetic quality.

In addition, the integrated pressure sensors may be disposed on both of the longer sides of the display device so that a user's fingers are naturally positioned when the user holds the display device. As a result, the user convenience of the display device can be improved Additional features of the inventive concepts will be set forth in the description which follows, and in part will be apparent from the description, or may be learned by practice of the inventive concepts.

According to one or more embodiments of the invention, a display device includes: a display panel; an input sensing panel; a display flexible circuit board to control the display panel having an input sensing driving circuit electrically connected to the input sensing panel, the display flexible circuit board being connected to the display panel; and a first pressure sensor disposed adjacent to and extending along a first edge of the display panel, wherein the first pressure sensor is electrically connected to the input sensing driving circuit of the display flexible circuit board.

The display panel may include a flat portion and a first curved portion connected to one side of the flat portion, and wherein the first pressure sensor may overlap with the first curved portion.

The display device may further include: a first sensing flexible circuit board connecting the first pressure sensor with the display flexible circuit board, wherein the first pressure sensor may be electrically connected to the input sensing driving circuit via the first sensing flexible circuit board.

The display device may further include: a second pressure sensor disposed adjacent to a second edge of the display panel and extended along the second edge, wherein the second pressure sensor may be electrically connected to the input sensing driving circuit of the display flexible circuit board.

The display device may further include: a second sensing flexible circuit board connecting the second pressure sensor with the display flexible circuit board.

The first flexible circuit board may be connected to one end of the first pressure sensor adjacent to the display flexible circuit board and is extended along one side of the display panel adjacent to the display flexible circuit board.

The input sensing panel is disposed above the display panel, the display flexible circuit board being is disposed below the display panel, the display device further including: a frame disposed below the display panel and the display flexible circuit board; and a main circuit board disposed under the frame, wherein the frame includes a connect hole spaced from the main circuit board, and wherein one end of the display flexible circuit board is connected to the main circuit board via the connect hole.

The first pressure sensor may include a depression in an inner longer side thereof adjacent to the connect hole.

The first pressure sensor may include: a first base; a second base facing the first base; a first electrode disposed on a surface of the first base facing the second base; a second electrode disposed on the surface of the first base and separated from the first electrode; and a pressure sensing layer disposed on a surface of the second base facing the first base, wherein the first electrode and the second electrode are configured to contact the pressure sensing layer in response to a pressure applied to the first edge of the display panel.

The first pressure sensor may include a first pressure sensitive cell and a second pressure sensitive cell that sense a pressure independently, wherein the first electrode may be disposed between the first pressure sensitive and to the second pressure sensitive cell, and wherein the second electrode may be disposed in each of the first pressure sensitive cell and the second pressure sensitive cell.

The first electrode may include a first stem electrode extending in a first direction and a plurality of first branch electrodes extending from the stem electrode, wherein the second electrode may include a second stem electrode opposed to the first stem electrode and a plurality of second branch electrodes branched from the second stem electrode, and wherein the first branch electrodes and the second branch electrodes may be arranged alternately between the first stem electrode and the second stem electrode.

The first pressure sensor may further include a bump member disposed on another surface of the second base, and wherein the bump member may overlap with a part of a pressure sensitive layer.

The first flexible circuit board may be connected to a central portion of the first pressure sensor.

The first flexible circuit board may include a first pressure sensitive cell, a second pressure sensitive cell, a first sensing line connected to the first pressure sensitive cell, a second sensing line connected to the second pressure sensitive cell, and a driving line connected to the first pressure sensitive cell and the second pressure sensitive cell, and wherein the driving line may extend along the first edge via a non-sensing region between the first pressure sensitive cell and the second pressure sensitive cell.

The display device of may further include: a second pressure sensor disposed adjacent to and extending along a second edge of the display panel, wherein the second pressure sensor may be electrically connected to the input sensing driving circuit of the display flexible circuit board.

The display device may further include: a sensing flexible circuit board connecting the first pressure sensor, the second pressure sensor and the display flexible circuit board.

The sensing flexible circuit board may include: a first projecting part extending in a first direction and extending the first pressure sensor and the second pressure sensor; and a second projecting part extending in a second direction from the first projecting part and connected to the display flexible circuit board, and wherein the second projecting part may be closer to the first pressure sensor than to the second pressure sensor.

The sensing flexible circuit board may include a first line connecting the first pressure sensor with the display flexible circuit board, and a second line connecting the second pressure sensor with the display flexible circuit board, and wherein a line width of the second line may be different from a line width of the first line.

According to one or more implementations of the current invention, a display device including: a display panel; an input sensing panel; a touch flexible circuit board to control the input sensing panel and having an input sensing driving circuit electrically connected to the input sensing panel; and a first pressure sensor disposed adjacent to and extending along a first edge of the display panel, wherein the first pressure sensor is electrically connected to the input sensing driving circuit of the first flexible circuit board.

The display device may further include: a first sensing flexible circuit board directly connecting the first pressure sensor with the touch flexible circuit board.

The display device may further include: a display flexible circuit board disposed between the display panel and the touch flexible circuit board and connected to the display panel; and a first sensing flexible circuit board connecting the first pressure sensor with the display flexible circuit board, wherein the display flexible circuit board may electrically connect the first sensing flexible circuit board with the touch flexible circuit board.

According to one or more implementations of the current invention, a method of operating a display device having integrated pressure sensors disposed along at least one side of the device and no physical buttons includes: pressing at least one of the pressure sensors to operate a first, pre-programmed function of the display device.

The display device has integrated pressure sensors disposed along opposite sides of the device and the method further includes: squeezing pressure sensors disposed on the opposite sides of the device to operate a second pre-programmed function of the display device.

According to an exemplary embodiment of the invention, a display device includes pressure sensors disposed adjacent to the edges of a display panel, and a flexible circuit board connected to the pressure sensors for sensing a pressure applied by a user, thereby allowing a user to make an input easily.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
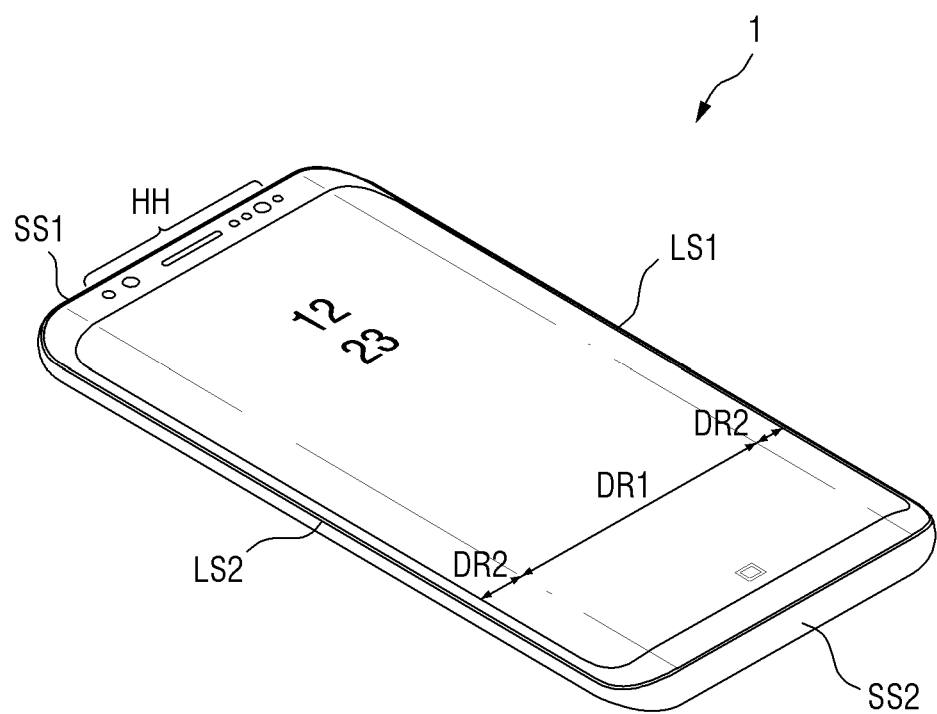
FIG. 1 is a perspective view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described with reference to the accompanying drawings.

Figure 2:
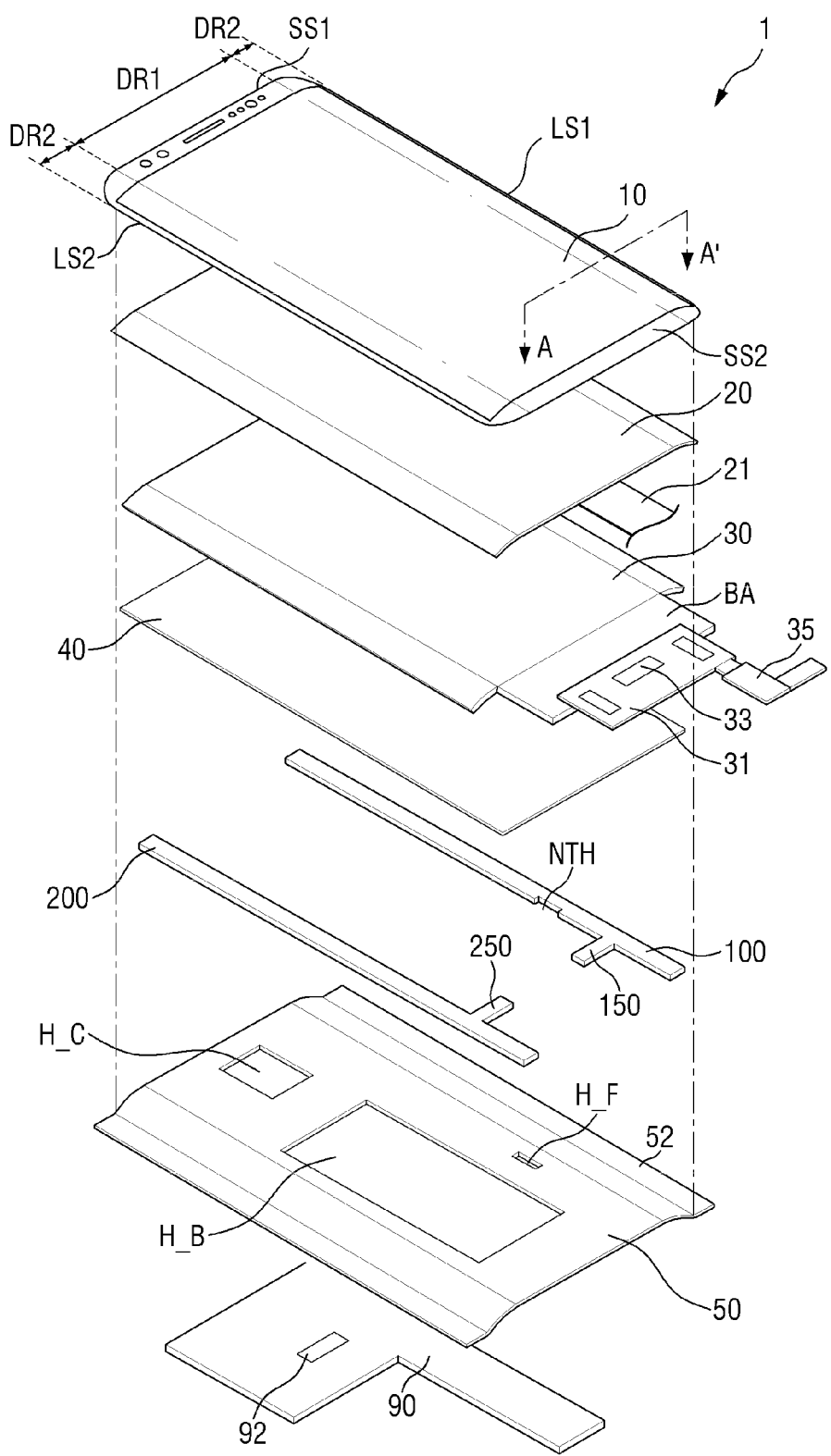
FIG. 2 is an exploded perspective view of an example of the display device shown in FIG. 1.
Figure 3:
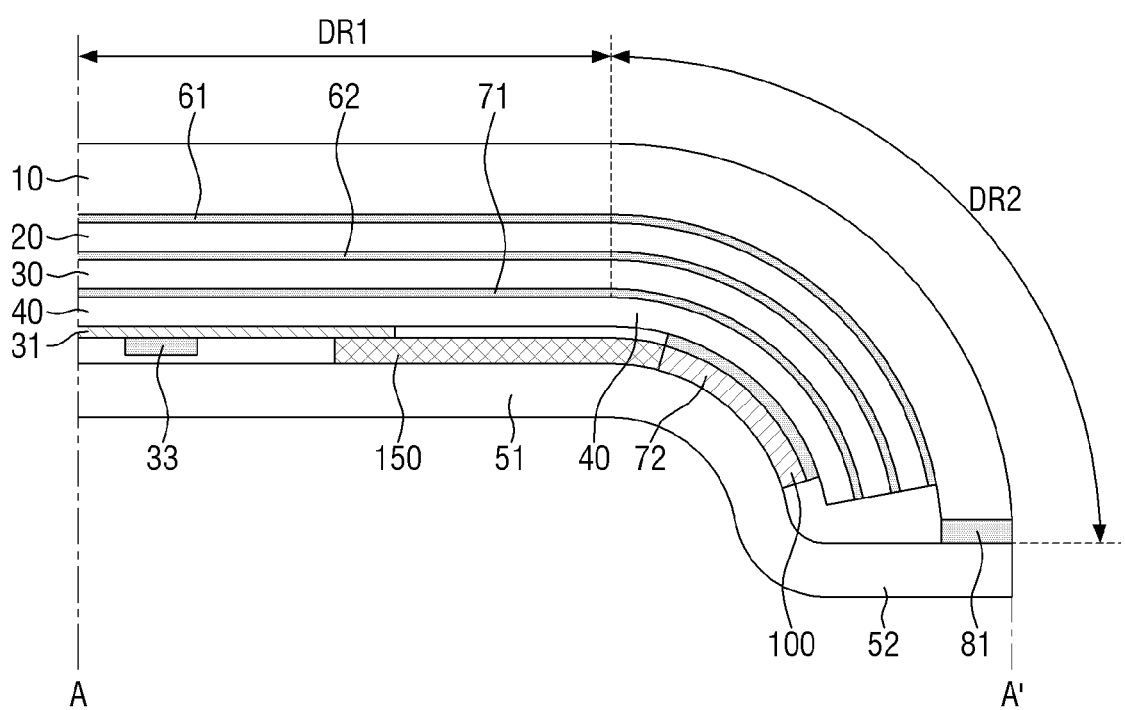
FIG. 3 is a cross-sectional view showing an example of a display device taken along sectional line AA' of FIG. 2.
Figure 4:
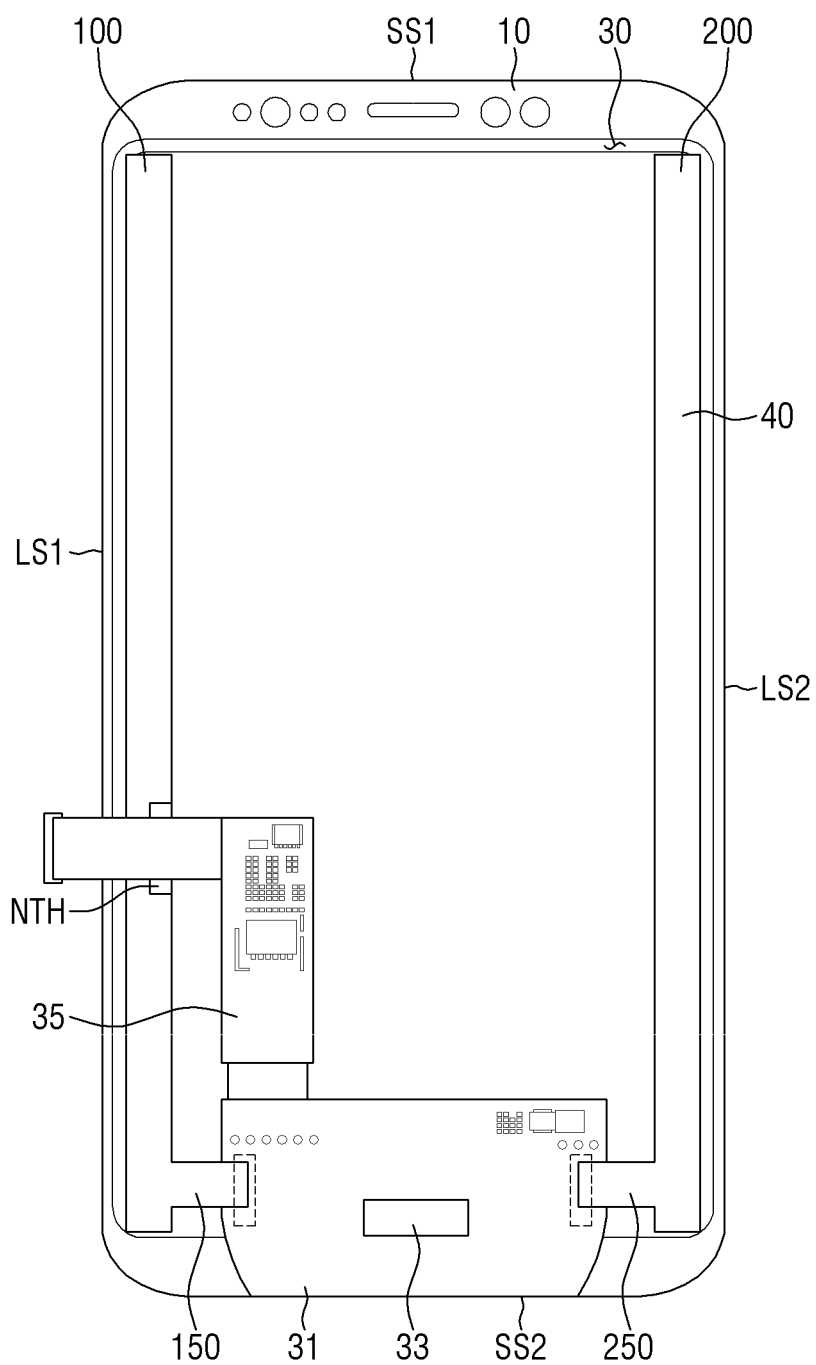
FIG. 4 is a rear view of an example of the display panel included in the display device 2 of FIG. 2.

FIG. 1 is a perspective view of a display device 1 construed according to an exemplary embodiment of the invention. FIG. 2 is an exploded perspective view of an example of the display device 1 shown in FIG. 1. FIG. 3 is a cross-sectional view showing an example of a display device 1 taken along a sectional line AA' of FIG. 2. FIG. 4 is a rear view of an example of the display panel 30 included in the display device 1 of FIG. 2.

Referring to FIG. 1, the display device 1 may have a substantially rectangular shape when viewed from the top, i.e., in a plan view. The display device 1 may be a rectangle having right angled corners or rounded corners when viewed from the top. The display device 1 may have longer sides LS1 and LS2 and shorter sides SS1 and SS2. In describing the rectangular display device 1 or the display panel 30 or the like included therein, the longer side located on the first side in the plan view is referred to as a first longer side LS1, and the longer side located on the left side is referred to as a second longer side LS2, the shorter side located on the upper side is referred to as a first shorter side SS1, and the shorter side located on the lower side is referred to as a second shorter side SS2. The length of each of the longer sides LS1 and LS2 of the display device 1 may be, but is not limited to being, in a range of 1.5 times to 2.5 times the length of the shorter sides SS1 and SS2.

As used herein, "above" and "upper surface" in the thickness direction refers to the direction of the display panel 30 in which images are displayed, whereas "below" and "lower surface" refers to the opposite direction of the display panel 30, unless stated otherwise. In addition, "upper side," "lower side," "left side," and "right side" in the plane are defined when the display surface is viewed from the top.

The display device 1 may include a first region DR1 and second regions DR2 located on different planes. The first region DR1 is placed in a first plane. The second regions DR2 are connected to the first region DR1 and are bent or curved therefrom. The second regions DR2 may be placed in a second plane intersecting with the first plane at a predetermined angle or may have a curved surface. The second regions DR2 of the display device 1 are disposed near the first region DR1. The first region DR1 of the display device 1 is used as a main display surface. The second regions DR2 may also be used as the display area of the display device 1 in addition to the first region DR1. In the following description, the first region DR1 of the display device 1 is a substantially flat portion while the second regions DR2 are curved portions as an example. However, the invention is not limited thereto.

The second regions DR2, which may be curved surfaces, may have a constant curvature or a varying curvature.

The second regions DR2 may be disposed at the edges of the display device 1, respectively. In an exemplary embodiment, the second regions DR2 may be disposed at the edges of the longer sides LS1 and LS2 of the display device 1 opposed to each other, respectively. However, the invention is not limited thereto. The second regions DR2 may be disposed on the edge of one side of the display device 1, may be disposed on each of the shorter sides SS1 and SS2, may be disposed on each of the edges of three sides, or may be disposed on the edges of all the sides.

Referring to FIGS. 2 and 3, the display device 1 includes a display panel 30 and pressure sensors 100 and 200 disposed around the outer edges of the display panel 30, respectively. The display device 1 may further include a window 10 disposed above the display panel 30, a cover panel sheet 40 disposed below the display panel 30, a frame 50 (or a middle frame, a middle mold frame), disposed below the cover panel sheet 40, and a main circuit board 90.

The display panel 30 is for displaying a screen. For example, an organic light-emitting display panel may be employed. In the following description, the organic light-emitting display panel is employed as the display panel 30. However, other types of display panels such as a liquid-crystal display panel and an electrophoretic display panel may also be employed. A display flexible circuit board 31 may be coupled with the display panel 30 to control operation of the light emitting elements in the display panel.

The display panel 30 includes a plurality of organic light-emitting elements disposed on a substrate. The substrate may be a rigid substrate made of glass, quartz, etc., or a flexible substrate made of polyimide or another polymer resin. When the substrate is a flexible substrate, the substrate may include a flexible substrate and a support substrate. Because the support substrate supports the flexible substrate, it may be less flexible than the flexible substrate. Each of the flexible substrate and the support substrate may include a flexible polymer material. For example, each of the flexible substrate and the support substrate may be polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof.

When the substrate is a flexible substrate, the display panel 30 may be curved, bent, folded or rolled. For example, as shown in FIG. 2, the display panel 30 may include a bending area BA disposed on the second shorter side SS2 and may be bent. The display flexible circuit board 31 may be attached to the bending area BA of the display panel 30. FIG. 4 is the rear view of at least a part of the display device 1 illustrating the window 10, the touch member 20, the display panel 30, the cover panel sheet 40, and the pressure sensors 100 and 200 assembled. As shown in FIG. 4, the display flexible circuit board 31 may be disposed on the lower surface of the display panel 30 by bending the bending area BA (or bending the display flexible circuit board 31). The display flexible circuit board 31 may be connected to the main circuit board 90 through a display connector 35 formed at one end thereof and may include a display driving circuit, e.g., a driving IC, for supplying a driving signal to the display panel 30.

In some exemplary embodiments, the display flexible circuit board 31 may further include an input sensing driving circuit 33. The input sensing driving circuit 33 may provide an input sensing driving signal to a touch member 20 to be described later or may receive a sensing signal in response to the input sensing driving signal. It may be implemented as an integrated circuit (IC). In addition, the input sensing driving circuit 33 may provide a pressure sensing driving signal to the pressure sensors 100 and 200 described later or may receive a pressure signal corresponding to the pressure sensing driving signal.

The window 10 is disposed on the display panel 30. The window 10 is disposed above the display panel 30 to protect the display panel 30 and transmits the light exiting from the display panel 30. The window 10 may be made of glass or transparent plastic.

The window 10 may overlap the display panel 30 and cover the front surface of the display panel 30. The window 10 may be larger than the display panel 30. For example, the window 10 may protrude outwardly from the shorter sides SS1 and SS2 of the display device 1. The window 10 may protrude from the display panel 30 also at the longer sides LS1 and LS2 of the display device 1. The window 300 may protrude more at the shorter sides SS1 and SS2 than at the longer sides LS1 and LS2.

Holes HH for exposing a front camera, a front speaker, an infrared sensor, an ultrasonic sensor, an illuminance sensor, etc. may be formed in the upper edge (e.g., the region adjacent to the first shorter side SS1) of the window 10. However, the invention is not limited thereto. For example, some or all of the front camera, the front speaker, the infrared sensor, the ultrasonic sensor and the illuminance sensor may be incorporated into the display panel 30, in which case some or all of the holes HH may be removed.

In some exemplary embodiments, the display device 1 may further include a touch member 20 (or an input sensing panel) disposed between the display panel 30 and the window 10. The touch member 20 may be of a rigid panel type, a flexible panel type, or a film type. The touch member 20 may have substantially the same size as the display panel 30 and may overlap it. For example, the sides of the touch member 20 may be aligned with the sides of the display panel 30 except the shorter side SS2 of the display panel 30. The display panel 30 may be coupled with the touch member 20 by a transparent coupling layer 61, and the touch member 20 may be coupled with the window 10 by a transparent coupling layer 62. Each of the transparent coupling layers 61 and 62 may include an optical transparent adhesive (OCA) and an optical transparent resin (OCR).

A touch flexible circuit board 21 may be coupled to the touch member 20. The touch flexible circuit board 21 may include lines for electrically connecting the touch member 20 with the input sensing driving circuit 33 of the display flexible circuit board 31.

According to the exemplary embodiments, the display device may exclude the touch member 20. When there is no touch member, the display panel 30 may be coupled with the window 10 by an optical transparent adhesive (OCA), an optical transparent resin (OCR), or the like. In some exemplary embodiment of the invention, the display panel 30 may include a touch electrode structure therein. Then, the touch flexible circuit board 21 may be eliminated, and the touch member 20 may be electrically connected to the display flexible circuit board 31 through a dummy pad and a dummy line formed in the display panel 30.

A cover panel sheet 40 may be disposed under the display panel 30. The cover panel sheet 40 may be attached to the lower surface of the display panel 30 by a coupling layer 71 such as a pressure-sensitive adhesive layer and an adhesive layer.

The cover panel sheet 40 is disposed such that it overlaps with the central portion of the display panel 30. The cover panel sheet 40 may have a size substantially equal to that of the display panel 30. Although the cover panel sheet 40 is shown as having the same size as that of the display panel 30 in FIGS. 2 and 3, the size of the cover panel sheet 40 is not limited thereto. For example, the cover panel sheet 40 may expose the lower surface of the display panel 30 by a predetermined width near the longer sides LS1 and LS2 of the display panel 30. The pressure sensors 100 and 200 may be disposed on the exposed part of the lower surface of the display panel 30.

The cover panel sheet 40 may perform a heat dissipation function, electromagnetic wave shielding function, pattern hiding function, grounding function, buffering function, strength enhancing function and/or digitizing function. The cover panel sheet 40 may include a functional layer having at least one of the above-described functions. The functional layer may be provided in a variety of forms such as a layer, a film, a sheet, a plate, and a panel. The cover panel sheet 40 may include one or more functional layers. For example, the cover panel sheet 40 may include a buffer sheet, a graphite sheet and a copper sheet that are sequentially stacked from top to bottom.

The pressure sensors 100 and 200 may overlap at least one outer edge of the cover panel sheet 40 or the display panel 30. A plurality of pressure sensors 100 and 200 may be provided. As shown in the drawings, the pressure sensors 100 and 200 may include a first pressure sensor 100 overlapping the outer edge of the first longer side LS1 of the cover panel sheet 40, and a second pressure sensor 200 overlapping the outer edge of the second longer side LS2 of the cover panel sheet 40. The pressure sensors 100 and 200 may be disposed in the second regions DR2 of the display device 1 forming the curved portions, respectively, but the invention is not limited thereto.

The pressure sensors 100 and 200 may be disposed in the second regions DR2 of the display device 1, respectively, and not in the first region DR1. However, the invention is not limited thereto. The pressure sensors 100 and 200 may be disposed in the second regions DR2 and may be extended in the width direction to reach a part of the first region DR1.

Although the pressure sensors 100 and 200 overlap with the display panel 30, in an exemplary embodiment, the area of the display panel 30 where the pressure sensors 100 and 200 overlap may be a non-display area around the display area. An outermost black matrix may be disposed in the non-display area of the display panel 30 around the display area. Although the pressure sensors 100 and 200 overlap with the touch member 20, the area of the touch member 20 where the pressure sensors 100 and 200 overlap may be a peripheral area where no touch electrode is disposed.

The pressure sensors 100 and 200 will be described in more detail later with reference to FIGS. 5, 6, 7, 8, 9, and 10.

In some exemplary embodiments, the pressure sensors 100 and 200 (or display device 1) may further include first and second sensing flexible circuit boards 150 and 250. The first sensing flexible circuit board 150 may connect the first pressure sensor 100 to the display flexible circuit board 31 and may transmit a driving signal (or a sensing signal) between the first pressure sensor 100 and the display flexible circuit board 31 (or the input sensing driving circuit 33 of the display flexible circuit board 31). As shown in FIG. 4, the first sensing flexible circuit board 31 may be disposed adjacent to the second shorter side SS2 of the display device 1, may be connected to an end of the first pressure sensor 110 (e.g., the end adjacent to the display flexible circuit board 31), and may connect the first pressure sensor 100 with the display flexible circuit board 31 via the shortest distance. In this case, the length of a line in the first pressure sensor 100 can be relatively shortened, such that it is possible to prevent sensitivity deterioration due to an increase in the line length.

Similarly, the second sensing flexible circuit board 250 may connect the second pressure sensor 200 to the display flexible circuit board 31 and may transmit a driving signal or a sensing signal between the second pressure sensor 200 and the display flexible circuit board 31 or the input sensing driving circuit 33 of the display flexible circuit board 31.

Although the first sensing flexible circuit board 150 is shown as being integrally formed with the first pressure sensor 100 in FIGS. 2 and 4, this is merely illustrative. For example, the first sensing flexible circuit board 150 may be fabricated independently of the first pressure sensor 100 and may be connected to one side of the first pressure sensor 100 in a typical coupling manner; for example, by bonding using an anisotropic conductive film (ACF), by ultrasonic bonding, by inserting using a connector, etc.

The frame 50 is disposed below the pressure sensors 100 and 200 and the cover panel sheet 40. The frame 50 may be a container for accommodating other components or a protective container. For example, the frame 50 may accommodate the window 10, the touch member 20, the display panel 30, the pressure sensors 100 and 200, and the cover panel sheet 40.

The frame 50 may include a bottom 51 and a sidewall 52 bent from the sides of the bottom 51.

The bottom 51 of the frame 50 is opposed to the pressure sensors 100 and 200 and the cover panel sheet 40. The pressure sensors 100 and 200 and the cover panel sheet 40 may be attached to the bottom 51 of the frame 50 through a coupling layer such as a pressure-sensitive adhesive layer or an adhesive layer. The coupling layer for attaching the pressure sensors 100 and 200 may be, but is not limited to, a waterproof tape.

The side wall 52 of the frame 50 faces the side surfaces of the touch member 20, the display panel 30, the pressure sensors 100 and 200, and the cover panel sheet 40. The upper end of the side wall 52 of the frame 50 faces the window 10. The outer side surface of the frame 50 may be aligned with the outer side surface of the window 10. The window 10 may be attached to the frame 50 through the waterproof tape 81.

The frame 50 may include a connect hole H_F via which the display connector 35 passes near the edge of the first longer side LS1. The connect hole 53 may pass through the bottom 51 of the frame 50 in the thickness direction and may have a slit shape. The first pressure sensor 100 may include a depression NTH in the form of notch in the vicinity of the connect hole 53 of the frame 50.

The frame 50 may further include a sensor hole H_C and a battery hole H_B. Each of the sensor hole H_C and the battery hole H_B may pass through the frame 50. When the display device 1 includes a sensor such as a camera device, the camera device may be disposed in line with the sensor hole H_C. Similarly, when the display device 1 includes a battery device, the battery device may be disposed in the battery hole H_B.

The main circuit board 90 may be disposed under the frame 50 and may include a main connection terminal CT_F and a main processor 92.

The main connection terminal CT_F may be connected to the connector 35 of the display flexible circuit board 31 through the connect hole H_F.

The main processor 92 may control all the functions of the display device 1. The configuration of the main circuit board 90 will be described in more detail later with reference to FIGS. 11 and 12.

Hereinafter, the pressure sensors 100 and 200 will be described in detail, followed by the description of the main circuit board 90. It is to be noted that the second pressure sensor 200 is substantially identical to the first pressure sensor 100 except for the depression NTH in the form of notch. Accordingly, only the first pressure sensor 100 will be described.

Figure 5:
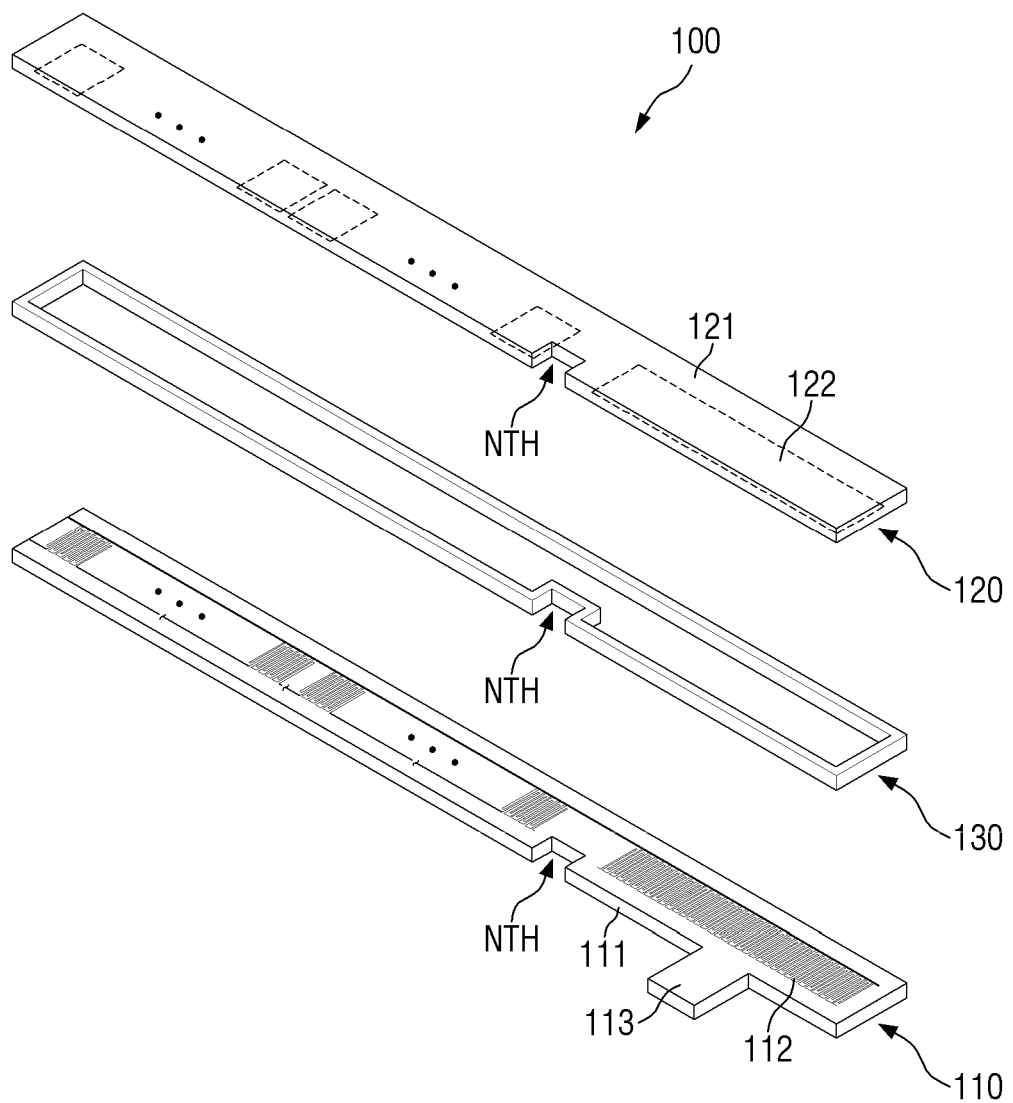
FIG. 5 is an exploded perspective view showing an example of a pressure sensor included in the display device of FIG. 2.
Figure 6:
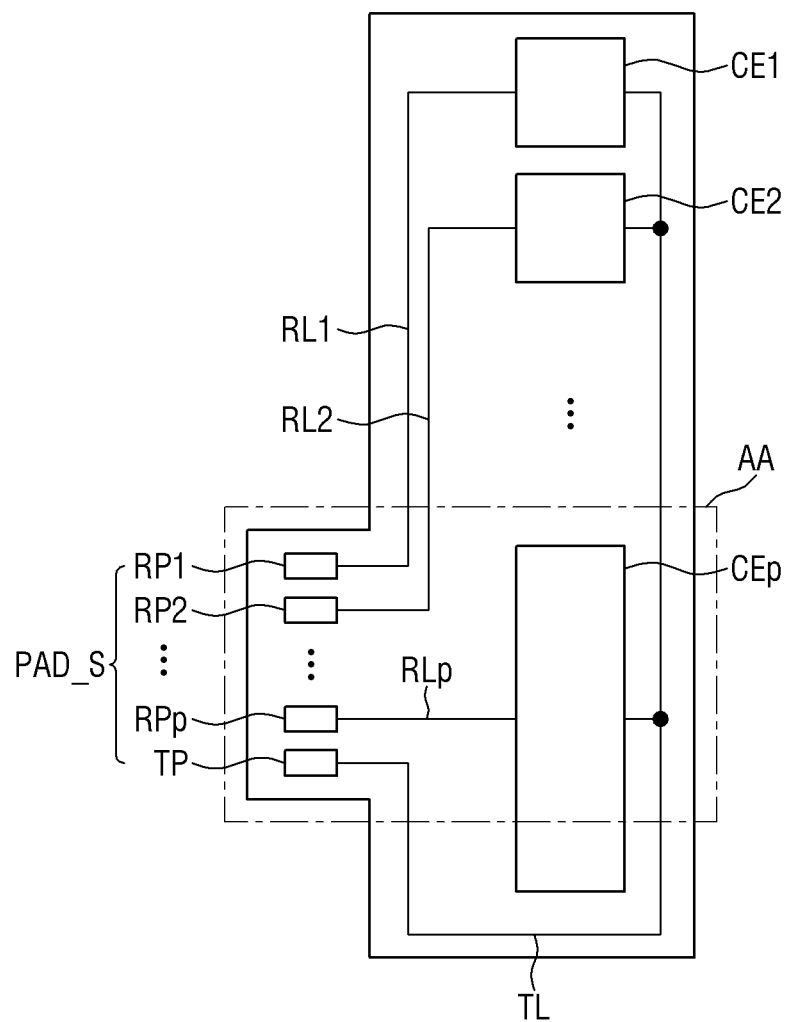
FIG. 6 is a circuit diagram showing an example of the pressure sensor of FIG. 5.
Figure 7:
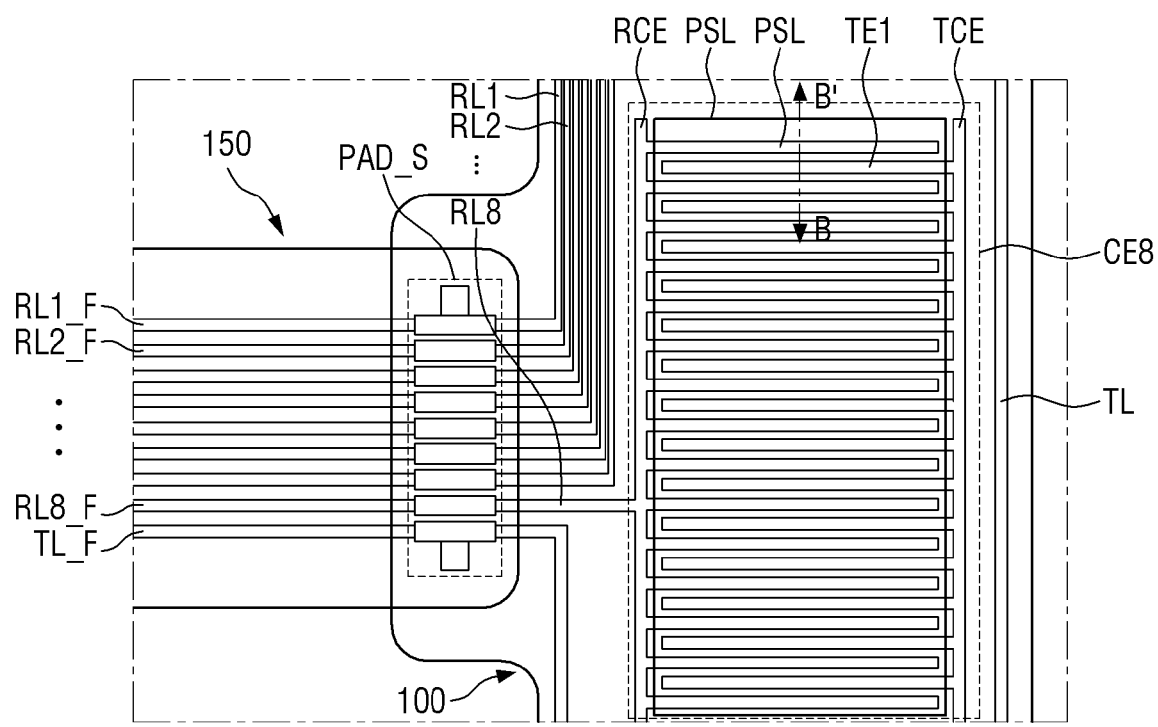
FIG. 7 is an enlarged view showing a layout of area AA in FIG. 6.
Figure 8:
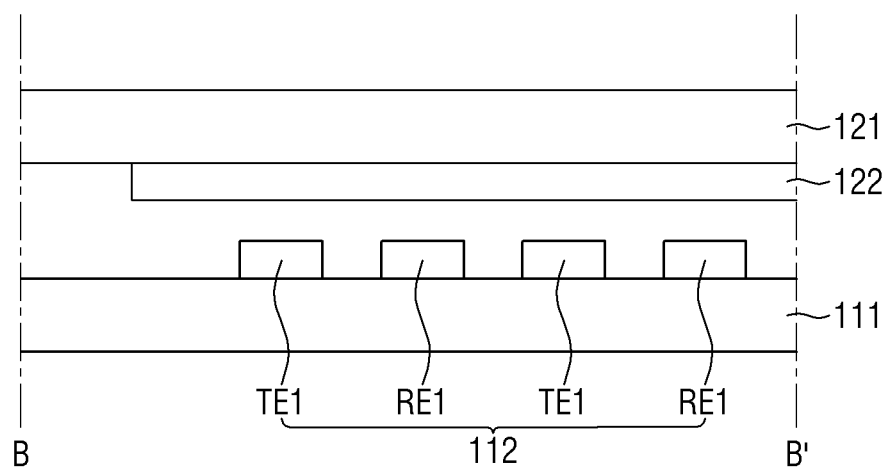
FIG. 8 is a cross-sectional view showing an example of a pressure sensor taken along a sectional line BB' in FIG. 7.
Figure 9:
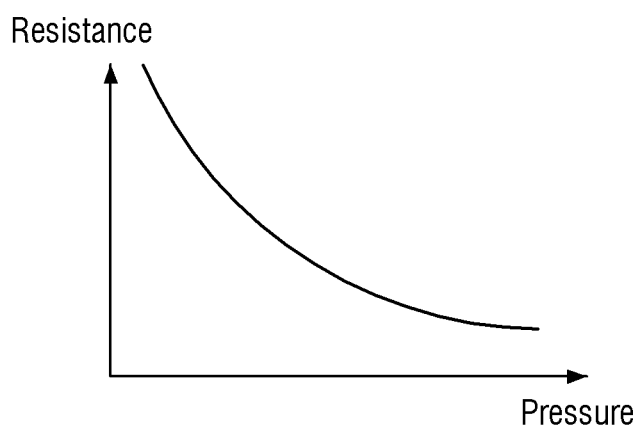
FIG. 9 is a graph illustrating the electrical resistance verses pressure sensed in a pressure sensing layer included in the pressure sensor of FIG. 7.

FIG. 5 is an exploded perspective view showing an example of a pressure sensor 100 included in the display device of FIG. 2. FIG. 6 is a circuit diagram showing an example of the pressure sensor 100 of FIG. 5. FIG. 7 is an enlarged view showing a layout of area AA in FIG. 6. FIG. 8 is a cross-sectional view showing an example of a pressure sensor 100 taken along a sectional line BB' in FIG. 7. FIG. 9 is a graph illustrating the electrical resistance verses pressure sensed by a pressure sensing layer included in the pressure sensor of FIG. 7.

Initially, referring to FIG. 5, the first pressure sensor 100 has a shape extended in one direction when viewed in plan. The length of the pressure sensor 100 in the longitudinal direction may be larger than the width. For example, the width of the first pressure sensor 100 may range from 2 mm or more and 6 mm or less. The length of the first pressure sensor 100 may be substantially similar to the length of the longer sides LS1 and LS2 of the display device 1. The length of the first pressure sensor 100 may range from, but is not limited to, 80% or more and 98% or less of the length of the longer sides LS1 and LS2 of the display device 1. In an exemplary embodiment, the length of the first pressure sensor 100 may range from 50 mm or more and 300 mm or less, or more particularly, from 100 mm or more and 150 mm or less. The shape of the pressure sensor 100 may vary depending on the location where it is disposed.

The first pressure sensor 100 includes a first substrate 110 and a second substrate 120 facing each other. The first substrate 110 includes a first base 111 and an electrode layer 112. The second substrate 120 includes a second base 121 and a pressure sensing layer 122 or pressure sensitive layer. The first substrate 110 and the second substrate 120 are coupled by the coupling layer 130. Each of the first substrate 110 and the second substrate 120 may be, but is not limited to, a film.

Each of the first base 111 and the second base 121 may include a material such as polyethylene, polyimide, polycarbonate, polysulfone, polyacrylate, polystyrene, polyvinyl chloride, polyvinyl alcohol, poly(norbornene), and poly ester. According to an exemplary embodiment of the invention, each of the first base 111 and the second base 121 may be formed as a polyethylene terephthalate (PET) film or a polyimide film.

The electrode layer 112 is disposed on one surface of the first base 111. The surface of the first base 111 faces the second base 121. The thickness of the electrode layer 112 may range from 2 μm or more and 8 μm or less. For example, the thickness of the electrode layer 112 may be approximately 4 μm. The electrode layer 112 may include a conductive material such as silver (Ag) and copper (Cu). The electrode layer 112 may be formed by screen printing.

The first base 111 may include a protrusion 113 formed on one side. Pads may be formed on the protrusion 113. The first base 111 may be coupled with the first sensing flexible circuit board 150 through the protrusion 113.

The pressure sensing layer 122 is disposed on one surface of the second base 121. The surface of the second base 121 faces the second base 111. The pressure sensing layer 122 may contain a pressure sensitive material. The pressure sensitive material may include metal nanoparticles such as nickel, aluminum, tin and copper, or carbon. The pressure sensitive material may be dispersed in a polymer resin in the form of particles. However, the invention is not limited thereto. As shown in FIG. 9, the pressure sensing layer 122 has characteristics that the electrical resistance decreases as the pressure increases. The first pressure sensor 100 utilizes such characteristic of the pressure sensing layer 122 to thereby sense whether a pressure is applied and the magnitude of the pressure if so.

The pressure sensing layer 122 may be thicker than the electrode layer 112. The thickness of the pressure sensing layer 122 may range from 4 μm or more and 12 μm or less. For example, the thickness of the pressure sensing layer 122 may be approximately 8 μm. It is to be understood that this is merely illustrative and the pressure sensing layer 122 is not limited thereto.

The first pressure sensor 100 may further include a coupling layer 130 disposed between the first base 111 and the second base 121 to couple them. The coupling layer 130 may be disposed along the periphery of the first base 111 and the second base 121. In an exemplary embodiment, the coupling layer 130 surrounds the first base 111 and the second base 121 to seal the first pressure sensor 100. That is, the coupling layer 130 may work as a gasket. In addition, the coupling layer 130 may also work as a spacer that maintains the distance between the first base 111 and the second base 121. The coupling layer 130 may not overlap with the electrode layer 112 and the pressure sensing layer 122.

The thickness of the coupling layer 130 may range from 5 μm or more and 50 μm or less, or more particularly, from 12 μm or more and 30 μm or less.

The coupling layer 130 may be implemented as a pressure-sensitive adhesive layer or an adhesive layer. The coupling layer 130 may be first attached to one surface of the first base 111 or the second base 121, and then attached to one surface of the other during the process of assembling the first base 111 and the second base 121. As another example, a coupling layer may be disposed on each of one surface of the first base 111 and one surface of the second base 121, and then the coupling layer on the first base 111 may be attached to the coupling layer on the second base 121 during the process of assembling the first base 111 and the second base 121.

When the first pressure sensor 100 is disposed in the display device 1, the first base 111 on which the electrode layer 112 is formed may be disposed to face the display panel 30. That is, the other surface (for example, the outer side surface) of the first base 111 may be attached to the lower surface of the display panel 30, and the other surface (for example, the outer side surface) of the second base 121 may be attached to the frame 50. However, the invention is not limited thereto. The first base 111 and the second base 121 may be disposed in the opposite orientation in the display device 1. Referring to FIG. 6, the pressure sensor 100 includes a driving line TL, first to $p^{th}$ sensing lines RL1 to RLp, a driving pad TP, first to $p^{th}$ sensing pads RP1 to RPp, and pressure sensitive cells CE1 to CEp, where p is an integer equal to or greater than two. The driving pad TP and the first to $p^{th}$ sensing pads RP1 to RPp may be referred to as a pad unit PAD_S.

Each of the pressure sensitive cells CE1 to CEp may individually sense the applied pressure at the respective positions. Although the pressure sensitive cells CE1 to CEp shown in FIG. 6 are arranged in a single row, the invention is not limited thereto. The pressure sensitive cells CE1 to CEp may be arranged in several rows as desired. In addition, the pressure sensitive cells CE1 to CEp may be arranged at predetermined intervals as shown in FIG. 6 or may be arranged continuously.

The pressure sensitive cells CE1 to CEp may have different areas depending on the use. For example, when the pressure sensitive cells CE1 to CEp are used on behalf of physical buttons such as volume control buttons disposed on the side surface of the display device 1, the pressure sensitive cells CE1 to CEp may have similar areas to the physical buttons.

Each of the pressure sensitive cells CE1 to CEp may be connected to at least one driving line and at least one sensing line. For example, as shown in FIG. 6, while the pressure sensitive cells CE1 to CEp may be commonly connected to a single driving line TL and may be connected to the sensing lines RL1 to RLp, respectively. The first pressure sensitive cell CE1 may be connected to the driving line TL and the first sensing line RL1, and the $i^{th}$ pressure sensitive cell CEi may be connected to the driving line TL and the ith sensing line RLi, where i is a positive integer equal to or greater than two and less than p. In addition, the $(i+1)^{th}$ pressure sensitive cell CE(i+1) may be connected to the driving line TL and the $(i+1)^{th}$ sensing line RL(i+1), and the $p^{th}$ pressure sensitive cell CEp may be connected to the driving line TL and the $p^{th}$ sensing line RLp.

The driving line TL may be connected to the driving pad TP and may be extended along the edge of one side of the first pressure sensor 100. The first to $p^{th}$ sensing lines RL1 to RLp may be connected to the first to IP sensing pads RP1 to RPp, respectively, and may be extended along the edge of the other side of the first pressure sensor 100. The first sensing line RL1 may be connected to the first sensing pad RP1, the ith sensing line RLi may be connected to the ith sensing pad RPi, the $(i+1)^{th}$ sensing line RL(i+1) may be connected to the $(i+1)^{th}$ sensing pad RP(i+1), and the $p^{th}$ sensing line RLp may be connected to the $p^{th}$ sensing pad RPp. The driving pad TP and the first to $p^{th}$ sensing pads RP1 to RPp may be disposed on the protrusion 113 of the first base 111 and may be connected to the first sensing flexible circuit board 150 (see FIG. 2) via an anisotropic conductive film.

The first pressure sensor 100 may be operated based on a driving voltage applied from a pressure sensing unit, e.g., the input sensing driving circuit described above with reference to FIGS. 2, 3, and 4 through the first sensing flexible circuit board 150 (see FIG. 2). The pressure sensing unit may apply a driving voltage to the driving line TL through the driving pads TP and may sense current values or voltage values from the sensing lines RL1 to RLp through the sensing pads RP1 to RPp, such that the pressure applied to the pressure sensitive cells CE1 to CEp can be sensed.

Each of the pressure sensitive cells CE1 to CEp includes a driving connection electrode TCE, a sensing connection electrode RCE, first driving electrodes TE1, a first sensing electrode RE1, and a pressure sensing layer PSL.

The first sensing flexible circuit board 150 may include a first to $p^{th}$ sensing connection lines RL1_F to RLp_F and a driving connection line TL_F, and the first to $p^{th}$ sensing connection lines RL1_F to RLp_F and a driving connection line TL_F may be connected to the first to $p^{th}$ sensing pads RP1 to RPp and the driving pads TP, respectively.

Referring to FIG. 7, the driving connection electrode TCE or the first stem electrode is connected to the driving line TL and the first driving electrode TE1 or the first branch electrode. The driving connection electrode TCE is extended in the longitudinal direction; e.g., the vertical direction, and is connected to the driving line TL through one end; e.g., the lower end. The first driving electrodes TE1 may branch off in the width direction; e.g., the horizontal direction, of the driving connection electrode TCE. The sensing connection electrode RCE or the second stem electrode is connected to one of the sensing lines RL1 to RLp and the first sensing electrode RE1 or the second branch electrode, where p is eight in the example shown in FIG. 7. Specifically, the sensing connection electrode TCE is connected to one of the sensing lines RL1 to RL8 at one end in the longitudinal direction. The first sensing electrodes RE1 may branch off in the width direction of the sensing connection electrode RCE.

As shown in FIG. 8, the first driving electrode TE1 and the first sensing electrode RE1 may be disposed on the same layer. The first driving electrode TE1 and the first sensing electrode RE1 may be made of the same material. The first driving electrode TE1 and the first sensing electrode RE1 may be included in the electrode layer 112 described above with reference to FIG. 5.

The first driving electrodes TE1 and the first sensing electrodes RE1 are disposed adjacent to each other but are not connected to each other. The first driving electrodes TE1 and the first sensing electrodes RE1 may be arranged in parallel. The first driving electrodes TE1 and the first sensing electrodes RE1 may be alternately arranged in the longitudinal direction of the driving connection electrode TCE and the sensing connection electrode RCE. That is, the first driving electrode TE1 and the first sensing electrode RE1 may be repeatedly arranged in this order in the longitudinal direction of the driving connection electrode TCE and the sensing connection electrode RCE.

The pressure sensing layer PSL is disposed on one surface of the second base 121, as described above with reference to FIG. 5. The pressure sensing layer PSL may be disposed such that it overlaps with the first driving electrodes TE1 and the sensing electrodes RE1.

When no pressure is applied to the second base 121 in the thickness direction of the first pressure sensor 100, there is a gap between the pressure sensing layer PSL and the first driving electrodes TE1 and between the pressure sensing layer PSL and the sensing electrodes RE1 as shown in FIG. 8. That is, when no pressure is applied to the second base 121, the pressure sensing layer PSL is spaced apart from the first driving electrodes TE1 and the first sensing electrodes RE1.

When a pressure is applied to the second base 121 in the thickness direction of the first pressure sensor 100, the pressure sensing layer PSL may contact the first driving electrodes TE1 and the first sensing electrodes RE1. Accordingly, the first driving electrodes TE1 and the first sensing electrodes RE1 may be physically connected with one another through the pressure sensing layer PSL, and the pressure sensing layer PSL may work as an electrical resistance.

In some exemplary embodiments, the first pressure sensor 100 may further include a bump member 140. The bump member 140 will be described with reference to FIG. 10.

Figure 10:
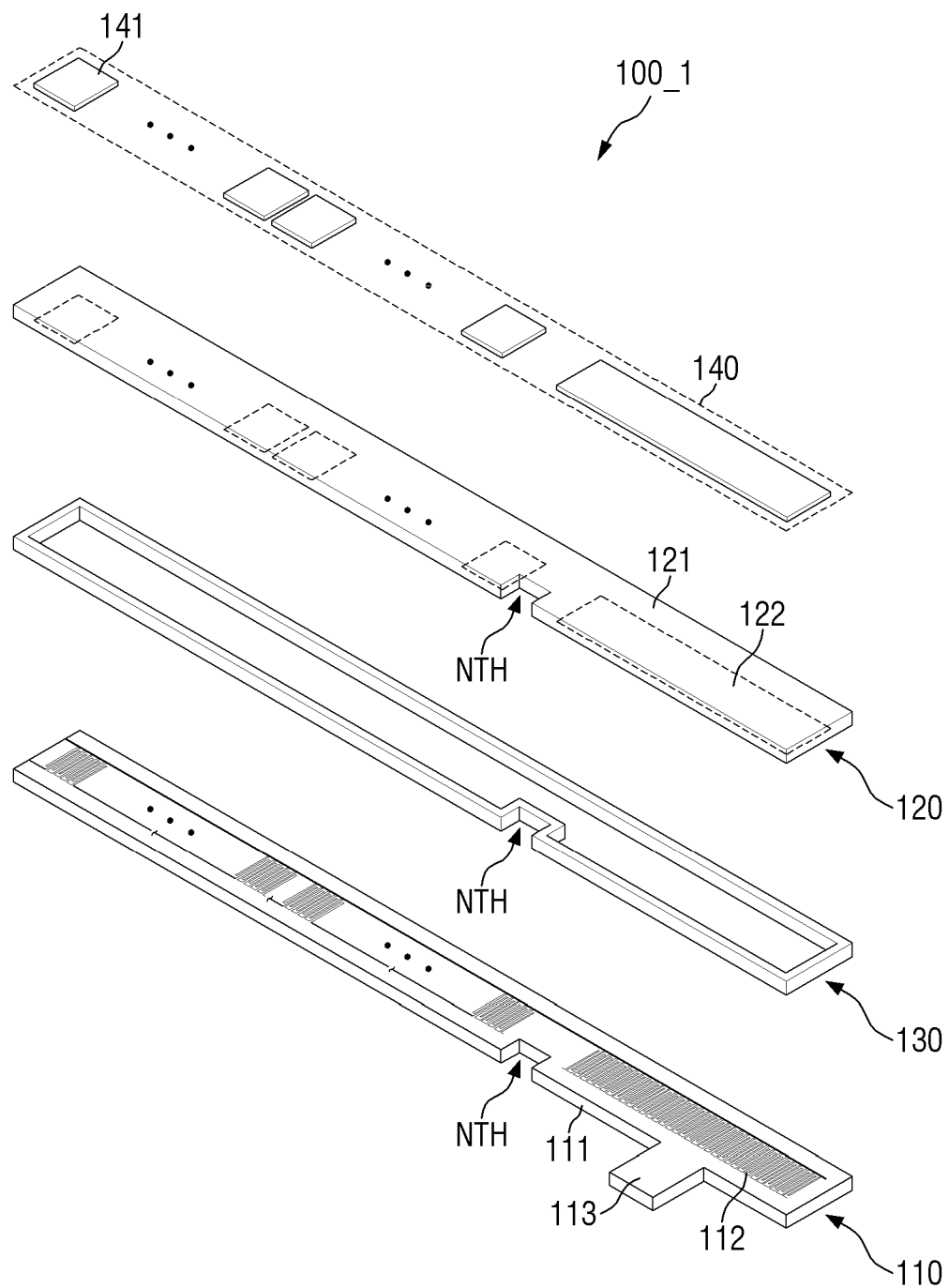
FIG. 10 is an exploded perspective view showing another example of the pressure sensor included in the display device of FIG. 2.

FIG. 10 is an exploded perspective view showing another example of the pressure sensor 100_1 included in the display device of FIG. 2. Referring to FIG. 10, like reference numerals denote like elements referring back to FIG. 5, and therefore, the detailed description of the like elements will be omitted here to avoid redundancy.

Referring to FIG. 10, the bump member 140 may be disposed on one surface of a first pressure sensor 100_1. The bump member 140 may include a plurality of first bump members 141 spaced apart from one another. The first bump members 141 may overlap with the pressure sensing layer 122. The first bump members 141 may overlap with a part of the pressure sensing layer 122.

The bump member 140 may be used to effectively transmit a pressure externally applied to the first pressure sensor 100_1. That is, the bump member 140 allows a touch pressure input by the user to be concentrated on the first pressure sensor 100_1. To this end, the bump member 140 may be formed of a flexible metal, for example, copper. The material of the bump member 140 is not particularly limited, and may be formed of an elastic material such as a flexible plastic and rubber, etc.

Although the bump member 140 is shown in FIG. 10 as being disposed on the upper surface of the first pressure sensor 100_1 (i.e., on one surface of the second base 121), the invention is not limited thereto. For example, the bump member 140 may be disposed on the lower surface of the first pressure sensor 100_1 (i.e., on one surface of the first base 111), or may be disposed on each of the upper surface and lower surface of the first pressure sensor 100_1.

Figure 11:
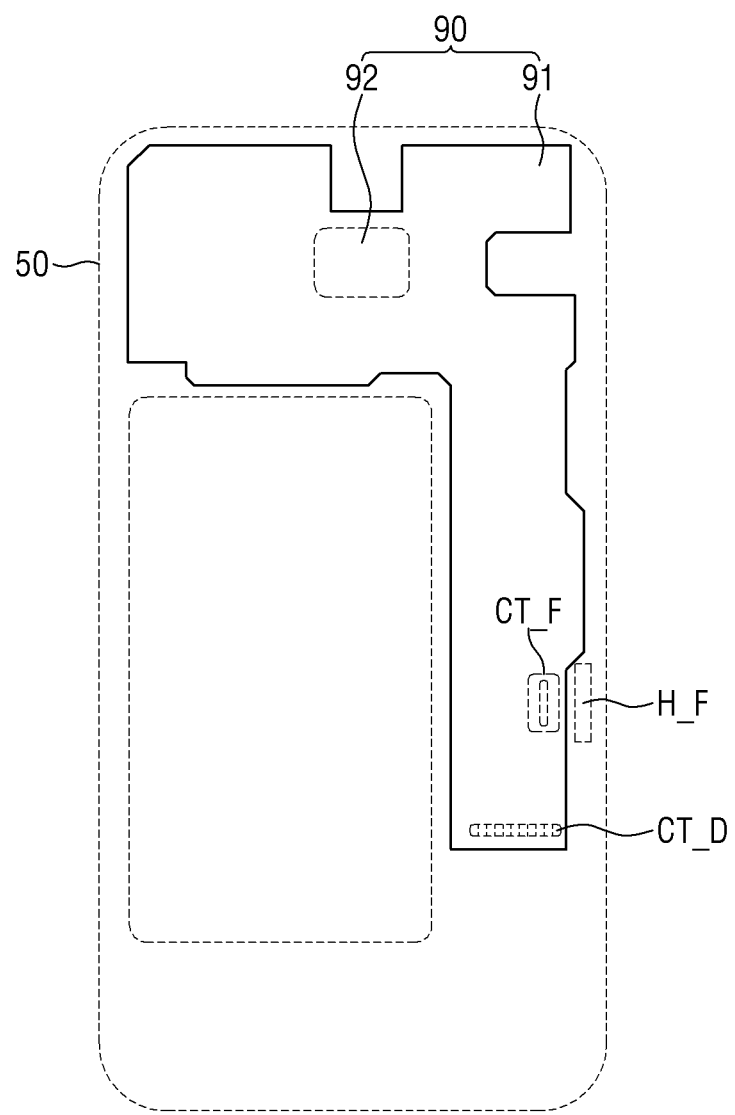
FIGS. 11 and 12 are views showing an example of a main circuit board included in the display device of FIG. 2.
Figure 12:
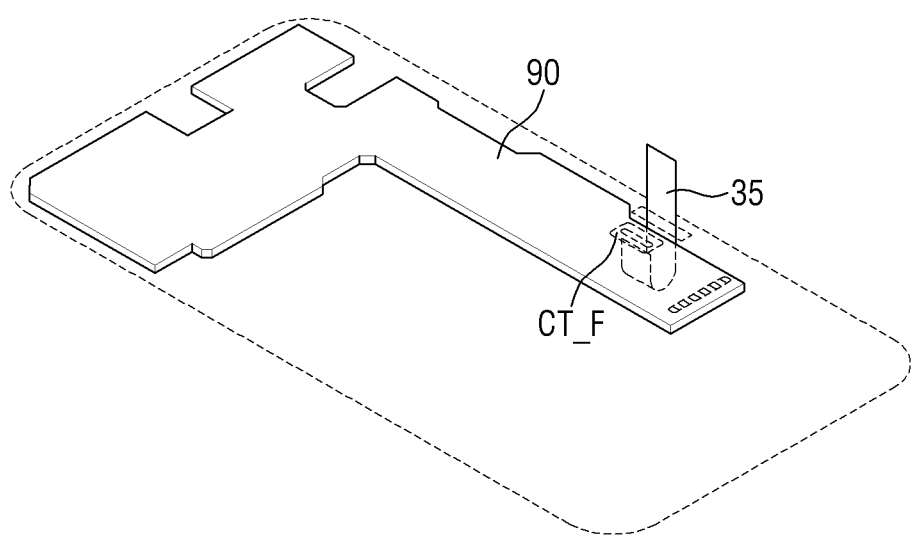

FIGS. 11 and 12 are views showing an example of a main circuit board 90 included in the display device of FIG. 2.

Referring to FIGS. 2, 11, and 12, the main circuit board 90 may include a substrate 91, connection terminals CT_F and CT_D, and a main processor 92.

The substrate 91 may not overlap with a battery hole H_B of the frame 50 and may have an "L" shape.

The main connection terminal CT_F may be disposed adjacent to the connect hole H_F of the frame 50 on the other surface (for example, the lower surface) of the substrate 91, but may not overlap the connect hole H_F. As shown in FIG. 12, the display connector 35 of the display flexible circuit board 31 may pass through the connect hole H_F of the frame 50 and may be bent at one side of and under the substrate 91 to be coupled with the main connection terminal CT_F. It is to be noted that the main connection terminal CT_F is not limited thereto. For example, the main connection terminal CT_F may be disposed on the surface of the substrate 91 so as to overlap the connect hole H_F.

The dummy connection terminal CT_D may be coupled with another device or a circuit board disposed in the display device 1.

The main processor 92 may control all the functions of the display device 1. For example, the main processor 92 may output image data to a display driver of the display flexible circuit board 31 so that the display panel 30 displays an image. In addition, the main processor 92 may receive touch data from a touch driver, e.g., a touch driver mounted on the display flexible circuit board 31 or the touch flexible circuit board 21, to determine the position of the user's touch, and then may execute an application indicated by the icon displayed at the position of the user's touch. In addition, the main processor 92 may receive pressure sensing data from a touch driver, e.g., a touch driver mounted on the display flexible circuit board 31 or the touch flexible circuit board 21, may output a home screen in response to the pressure sensing data, may control the volume of sound of the display device 1 or may provide a haptic feedback. The main processor 92 may be an application processor, a central processing unit, or a system chip implemented as an integrated circuit.

Figure 13:
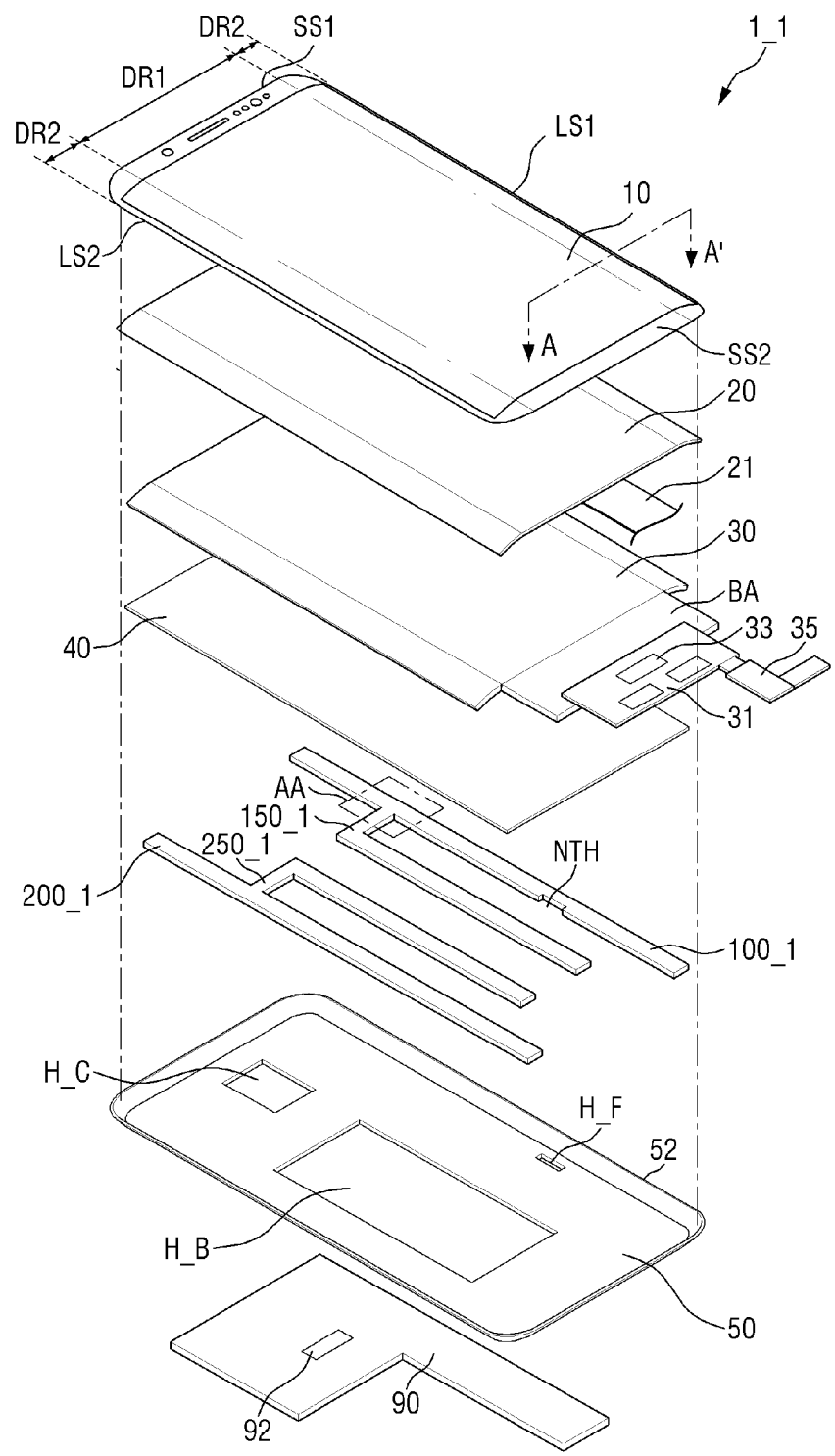
FIG. 13 is an exploded perspective view of another example of a display device constructed according to an exemplary embodiment of the invention.
Figure 14:
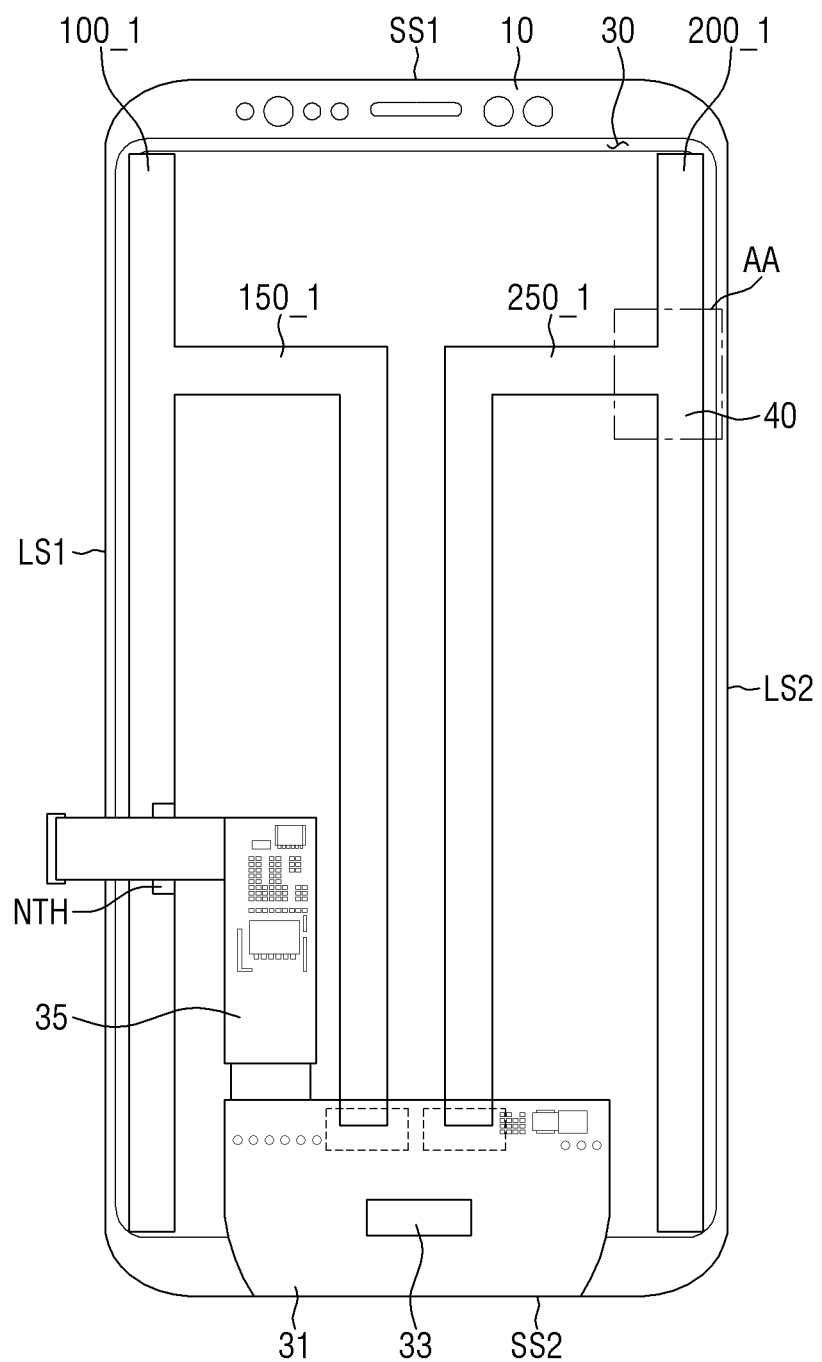
FIG. 14 is a rear view showing an example of the display device of FIG. 13.
Figure 15:
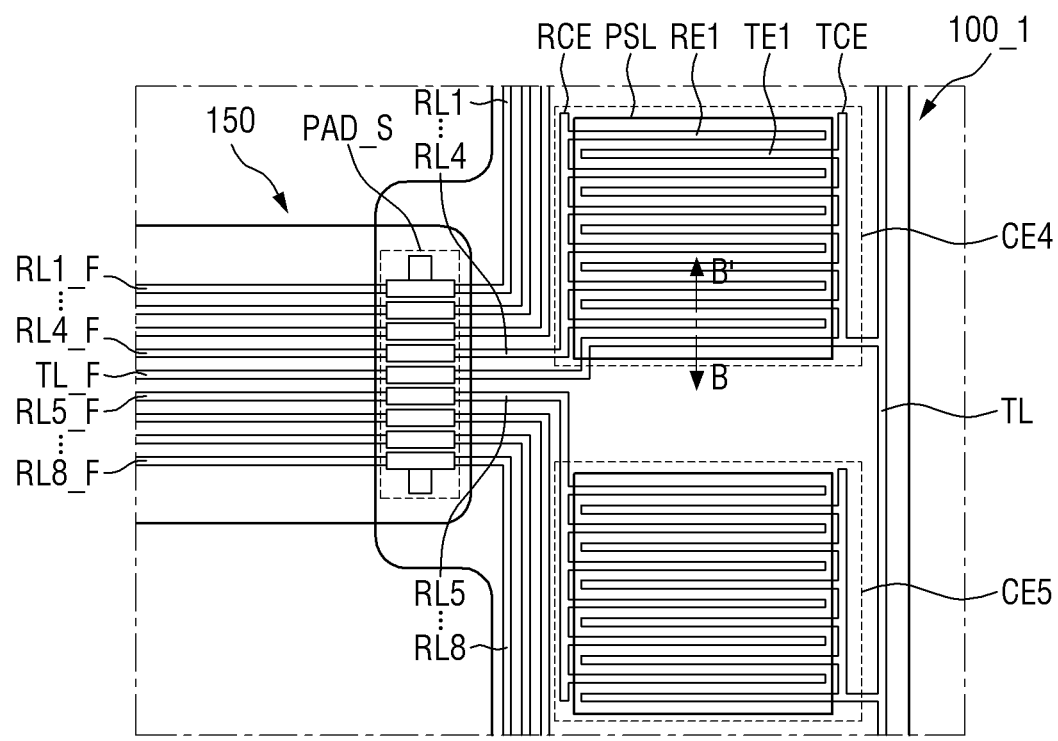
FIG. 15 is an enlarged view showing a layout of area AA of FIG. 14.

FIG. 13 is an exploded perspective view of another example of a display device 1_1 construed according to an exemplary embodiment of the invention. FIG. 14 is a rear view showing an example of the display device 1_1 of FIG. 13. FIG. 15 is an enlarged view showing a layout of area AA of FIG. 14.

Referring to FIGS. 1, 2, 13, 14, and 15, a display device 1_1 is different from the display device 1 of FIG. 2 in that the former includes pressure sensors 100_1 and 200_1 and sensing flexible printed circuit boards 150_1 and 250_1. The display device 1_1 is substantially identical to the display device 1 of FIG. 2 except for the pressure sensors 100_1 and 200_1 and the sensing flexible circuit boards 150_1 and 250_1 and, therefore, redundant descriptions will be omitted.

The first sensing flexible circuit board 150_1 may be extended from one side of the first pressure sensor 100 toward the second longer side LS2 of the display device 1, may be bent at the center portion of the display device 1 and extended toward the second shorter side SS2, and then may be connected to the display flexible circuit board 31. The end of the first sensing flexible printed circuit board 150_1 connected to the first pressure sensor 100 may be closer to the first shorter side SS1 than to the second shorter side SS2, i.e., the side adjacent to the display flexible circuit board 31. That is, the first sensing flexible circuit board 150 described above with reference to FIG. 2 may be closer to the second shorter side SS2, but the first sensing flexible circuit board 150_1 shown in FIGS. 13 and 14 may be closer to the first shorter side SS1.

The line in the first sensing flexible circuit board 150 (i.e., the line for electrically connecting the first pressure sensor 100_1 and the display flexible circuit board 31) becomes longer, and accordingly, the resistance value of the line may be increased. However, since the lengths of the first to $p^{th}$ sensing lines RL1 to RLp (see FIG. 6) of the first pressure sensor 100_1 are relatively reduced, the line resistance from the pressure sensitive cells CE1 to CEp to the display flexible circuit board 31 may not change significantly. As shown in FIG. 15, the first to $p^{th}$ sensing lines RL1 to RLp (for example, p=8) may be distributed in different directions with respect to the driving line TL from the pad unit PADS. Therefore, the first to $p^{th}$ sensing lines RL1 to RLp (for example, p=8) may have an increased width as compared to the sensing lines shown in FIG. 7. Accordingly, the first pressure sensor 100_1 can have a reduced line resistance as compared with the first pressure sensor 100 shown in FIG. 7.

Similarly, the second sensing flexible circuit board 250_1 may be extended from one side of the second pressure sensor 200 toward the first longer side LS2 of the display device 1, may be bent at the center portion of the display device 1 and extended toward the second shorter side SS2, and then may be connected to the display flexible circuit board 31.

Although the first sensing flexible circuit board 150_1 and the second sensing flexible circuit board 250_1 have the same shape and the same length in FIGS. 13 and 14, the invention is not limited thereto. For example, the second sensing flexible circuit board 250_1 may not overlap with the battery hole H_B, may be extended along the edge of the battery hole H_B, and may have a width larger than the width of the first sensing flexible circuit board 150_1; e.g., a width for the same line resistance as the line resistance of the first sensing flexible circuit board 150_1.

The first pressure sensor 100_1 may be substantially identical to the first pressure sensor 100 of FIG. 7 except for the driving line TL, the first to $p^{th}$ sensing lines RL1 to RLp (p is 8 in the example below) (or first to eighth sensing lines RL1 to RL8), the driving pad TP, the first to eighth sensing pads RP1 to RP8. Therefore, descriptions of the identical elements will omitted to avoid redundancy.

As the first sensing flexible circuit board 150_1 is connected to the central portion of the first pressure sensor 100_1, the driving pad TP of the pad unit PAD_S may be disposed between the first to the eighth sensing pads RP1 to RP8. As shown in FIG. 15, the first to fourth sensing pads RP1 to RP4 may be disposed on one side of the driving pad TP, and the fifth to eighth sensing pads RP5 to RP8 may be disposed on the other side of the driving pad TP. However, the invention is not limited thereto. The number of the sensing pads disposed on one side of the driving pad TP may be different from the number of the sensing pads disposed on the other side thereof.

The driving line TL may be disposed between the fourth pressure sensitive cell CE4 and the fifth pressure sensitive cell CE5 (or via a non-sensing region between the fourth pressure sensitive cell CE4 and the fifth pressure sensitive cell CE5), and may be extended along the other side of the first pressure sensor 100, and may be connected to the fourth pressure sensitive cell CE4 and the fifth pressure sensitive cell CE5 (or the first to eighth pressure sensitive cells CE1 to CE8).

The first to fourth sensing lines RL1 to RL4 may be extended toward one side (e.g., the upper side), and the fifth to eighth sensing lines RL1 to RL8 may be extended toward the other side (e.g., the lower side). When the widths of the area (for example, the line area) where the first to eighth sensing lines RL1 to RL8 are disposed are predetermined, the number of sensing lines RL1 to RL8 arranged in the same direction is become smaller than the number of the sensing lines shown in FIG. 7. Accordingly, the sensing lines RL1 to RL8 have a relatively increased width and accordingly can have a reduced line resistance. In addition, the width of the line area of the first pressure sensor 100_1 may be reduced.

Figure 16:
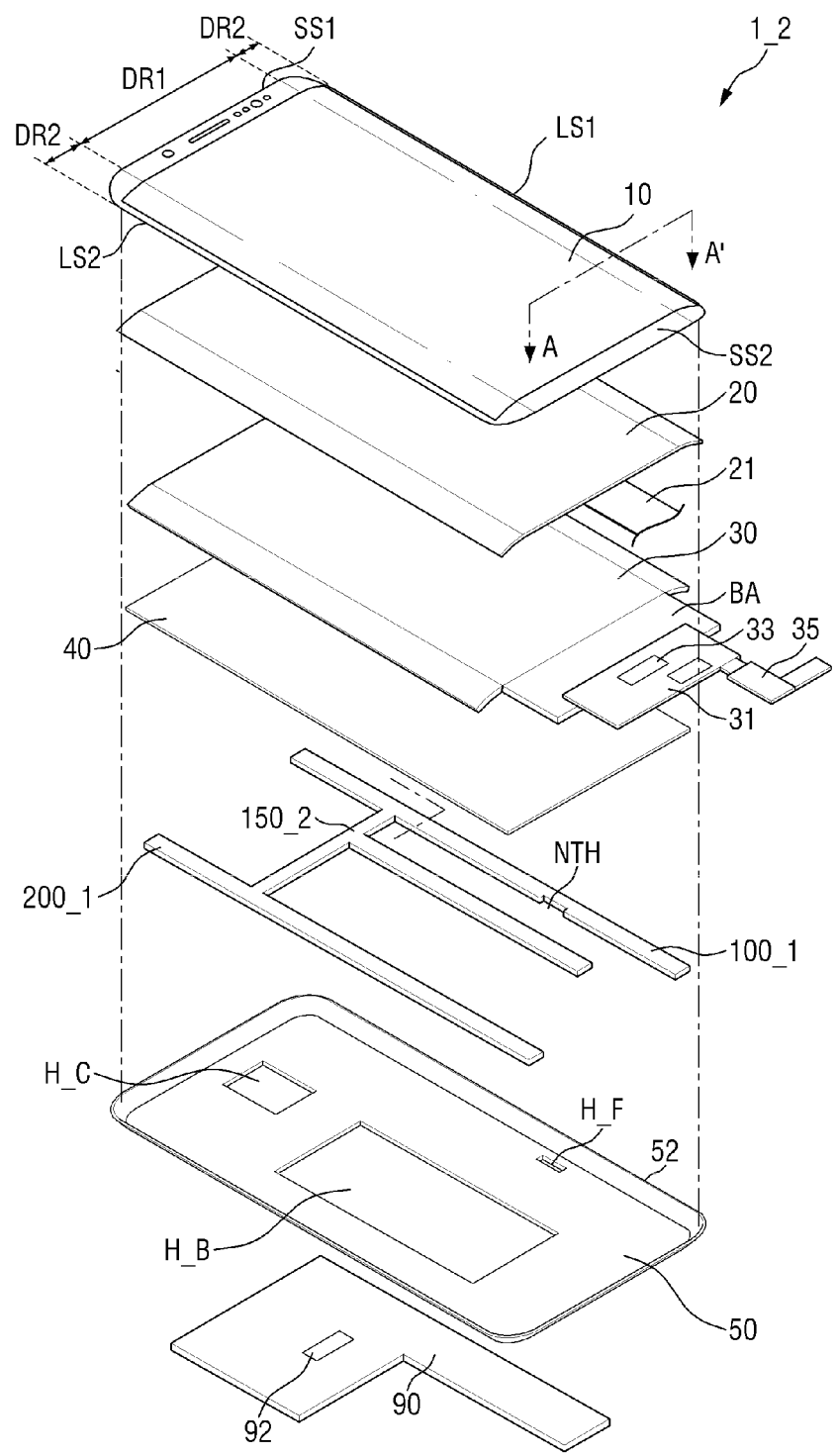
FIG. 16 is an exploded perspective view of another example of a display device constructed according to an exemplary embodiment of the invention.
Figure 17:
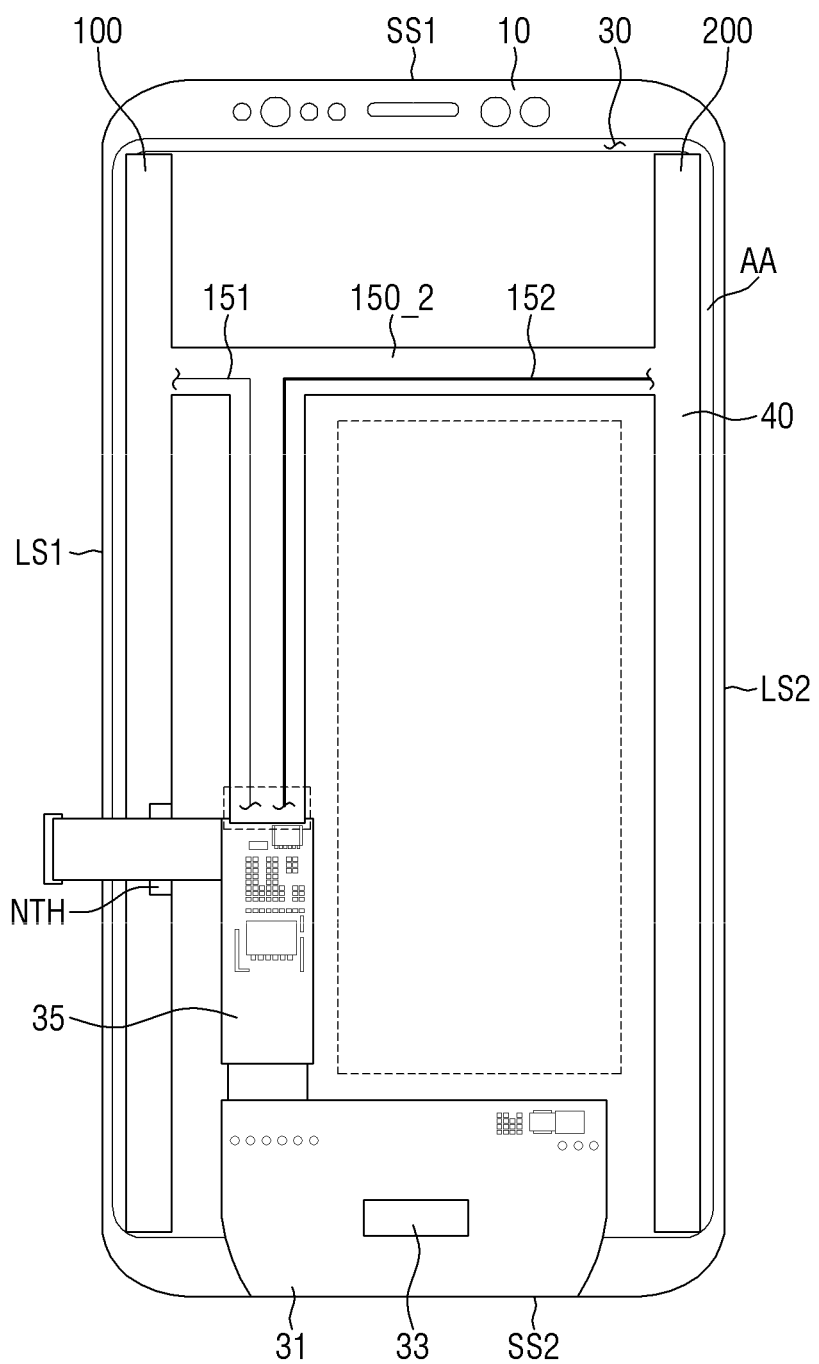
FIG. 17 is a rear view showing an example of the display device of FIG. 16.

FIG. 16 is an exploded perspective view of another example of a display device 1_2 construed according to an exemplary embodiment of the invention. FIG. 17 is a rear view showing an example of the display device 1_2 of FIG. 16.

Referring to FIGS. 13, 14, 15, 16, and 17, a display device 1_2 is different from the display device 1_1 of FIG. 13 in that the former includes a first sensing flexible circuit board 150_2.

The first sensing flexible circuit board 150_2 may connect the first pressure sensor 100_1 with the second pressure sensor 200_1 and may be connected to the display flexible circuit board 31.

The first sensing flexible circuit board 150_2 may include a horizontal part or a first extended part that is extended from the first pressure sensor 100_1 to the second pressure sensor 200_1 in the first direction and connects the first pressure sensor 100_1 with the second pressure sensor 200_1, and a vertical part or a second extended part that is extended from the horizontal part to the display flexible circuit board 31 or the second shorter side SS2 in the second direction and is connected to the display flexible circuit board 31.

The vertical part may be disposed closer to the first longer side LS1 than the second longer side LS2 of the display device 1. The vertical part may not overlap with the battery hole H_B of the frame 50 and may be disposed along the edge of the battery hole H_B. However, the invention is not limited thereto. The vertical part may be extended from the center portion of the horizontal part, and may be spaced apart substantially equally from the first longer side LS1 and the second longer side LS2 of the display device 1.

In some exemplary embodiments, the first sensing flexible circuit board 150_2 may include a first line 151 and a second line 152 having different line widths. The first line 151 may connect the first pressure sensor 100_1 with the display flexible circuit board 31. The second line 152 may connect the second pressure sensor 100_2 with the display flexible circuit board 31 and may have a line width larger than that of the first line 151. The second line 152 may have substantially the same line resistance as that of the first line 151.

Figure 18:
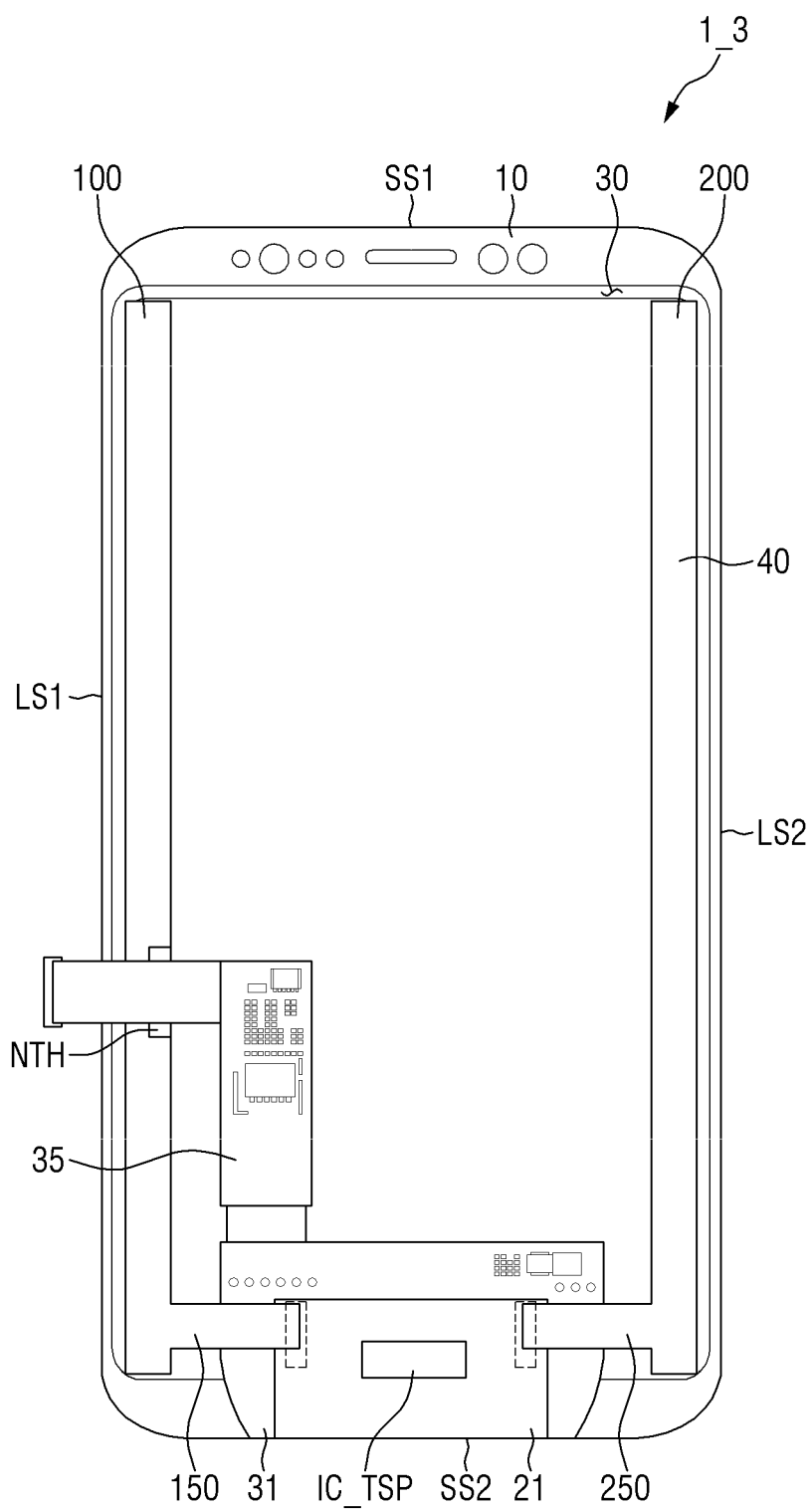
FIG. 18 is a rear view showing another example of the display device of FIG. 2.

FIG. 18 is a rear view showing another example of the display device 1_3 of FIG. 2.

Referring to FIGS. 2 and 18, a display device 1_3 is different from the display device 1 of FIG. 2 in that the former includes a touch flexible circuit board 21 on which a touch driving circuit IC_TSP is mounted.

The touch flexible circuit board 21 may be electrically connected to the display flexible circuit board 31 and may receive a control signal from the main circuit board 90 (or from an external device) through the display flexible circuit board 31 or may provide a sensing signal to the circuit board 90.

The touch driving circuit IC_TSP may provide an input sensing driving signal to a touch member 20 or may receive a sensing signal in response to the input sensing driving signal. It may be implemented as an integrated circuit (IC).

The first pressure sensor 100 and the second pressure sensor 200 may be connected to the touch flexible circuit board 21 (or a touch driving circuit (IC_TSP)). The first pressure sensor 100 may be connected to the touch flexible circuit board 21 through the first sensing flexible circuit board 150, and the second pressure sensor 200 may be connected to the touch flexible circuit board 21 through the second sensing flexible circuit board 250. The touch driving circuit IC_TSP may supply a driving signal to each of the first pressure sensor 100 and the second pressure sensor 200 and may receive the sensing signal in response to the signal, similarly to the input sensing driving circuit 33 described above with reference to FIG. 2. That is, it is possible to sense the pressure in the touch driving circuit IC_TSP.

Although the first pressure sensor 100 and the second pressure sensor 200 are shown in FIG. 18 as being connected to the touch flexible circuit board 21 on the second shorter side SS2 of the display device 1, this is merely illustrative. For example, the first pressure sensor 100 and the second pressure sensor 100_2 may be connected to the touch flexible circuit board 21 through the flexible circuit boards 100_1 and 200_1 described above with reference to FIG. 13 or through the first flexible circuit board 100_2 described above with reference to FIG. 16.

Figure 19:
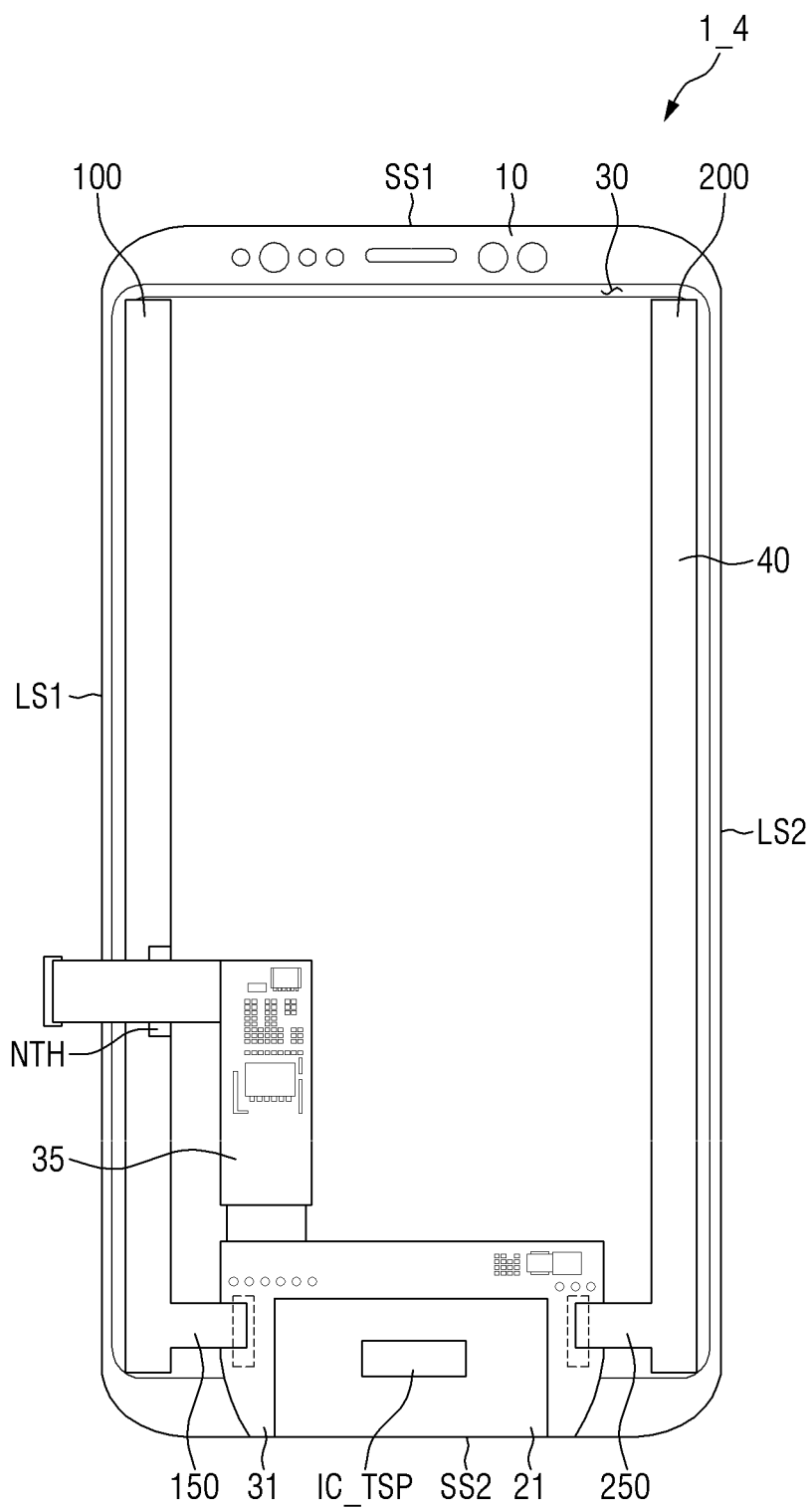
FIG. 19 is a rear view showing another example of the display device of FIG. 2.
Figure 20:
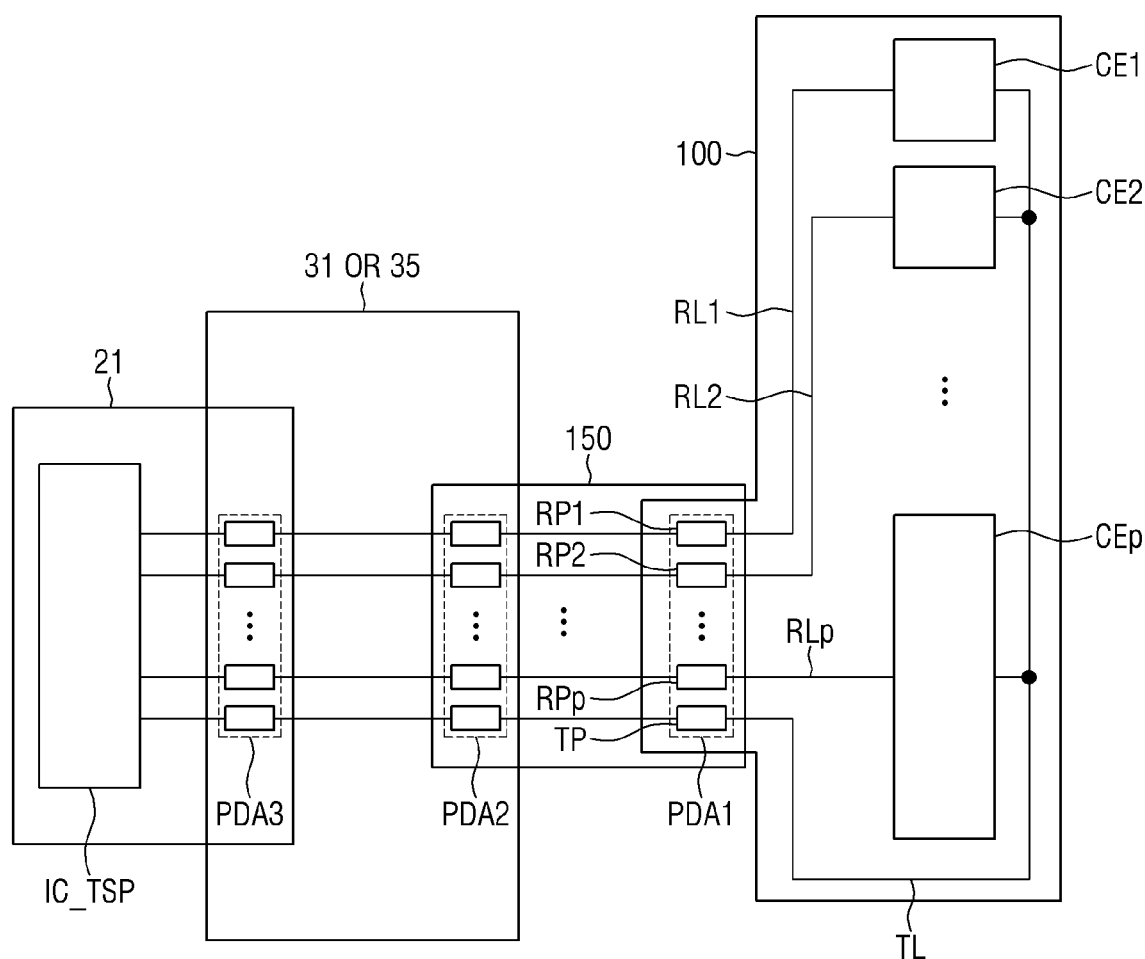
FIG. 20 is a circuit diagram for illustrating how the pressure sensor is connected to the touch flexible circuit board included in the display device of FIG. 19.

FIG. 19 is a rear view showing another example of the display device 1_4 of FIG. 2. FIG. 20 is a circuit diagram for illustrating how the pressure sensor 100 is connected to the touch flexible circuit board 21 included in the display device 1_4 of FIG. 19.

Referring to FIGS. 2, 4 and 19, a display device 1_4 is different from the display device 1 of FIG. 2 in that the former includes a touch flexible circuit board 21 on which a touch driving circuit IC_TSP is mounted.

The touch flexible circuit board 21 may be electrically connected to the display flexible circuit board 31 or the display connector 35 and may receive a control signal from the main circuit board 90 (or from an external device) through the display flexible circuit board 31 or the display connector 35, and may provide a sensing signal to the circuit board 90. In addition, the touch flexible circuit board 21 may be electrically connected to the pressure sensors 100 and 200 through the display flexible circuit board 31, and may provide a driving signal to each of the first pressure sensor 100 and the second pressure sensor 200, and may receive a sensing signal corresponding to the driving signal.

The touch driving circuit IC_TSP is substantially identical to the touch driving circuit IC_TSP described above with reference to FIG. 18; and, therefore, the redundant description will be omitted.

Referring to FIG. 19, the circuit configuration of the first pressure sensor 100 may be substantially identical to the circuit configuration of the first pressure sensor 100 of FIG. 6. Therefore, descriptions of the identical elements will omitted to avoid redundancy.

The first sensing flexible circuit board 150 may include pads disposed in the first and second pad areas PAD1 and PAD2, and lines for connecting the pads in the first pad area PAD1 with the pad in the second pad area PAD2, respectively. The pads included in the first pad area PAD1 may be connected to the driving pad TP and the sensing pads RP1 to RPp of the first pressure sensor 100, respectively.

Similarly, the display flexible circuit board 31 (or the display connector 35) may include the pads disposed in the second and third pad areas PAD2 and PAD3, and lines for connecting the pads disposed in the second areas PAD2 with the pad disposed in the third area PAD3, respectively.

Although not shown in FIG. 20, the display flexible circuit board 31 may further include pads and line for connecting the outside (e.g., the main circuit board 90 (see FIG. 2)) with the touch flexible circuit board 21.

The touch flexible circuit board 21 may include a touch driving circuit IC_TSP, pads disposed in the third pad area PAD3, and lines connecting the pads with the touch driving circuit IC_TSP.

That is, the pressure sensitive cells CE1 to CEp of the first pressure sensor 100 may be electrically connected to the touch driving circuit IC_TSP through the display flexible circuit board 31 and the first sensing flexible circuit board 150. Accordingly, the touch driving circuit IC_TSP may provide a driving signal to the first pressure sensor 100 and may receive the sensing signal corresponding to the driving signal from the first pressure sensor 100.

As described above with reference to FIGS. 18, 19, and 20, the display device 1 may include a touch driving circuit IC_TSP mounted on the touch flexible circuit board 21, and the touch driving circuit IC_TSP may be connected directly/indirectly to the sensors 100 and 200 to sense the pressure applied to the display device 1 (or the pressure sensors 100 and 200) from the outside.

Figure 21A:
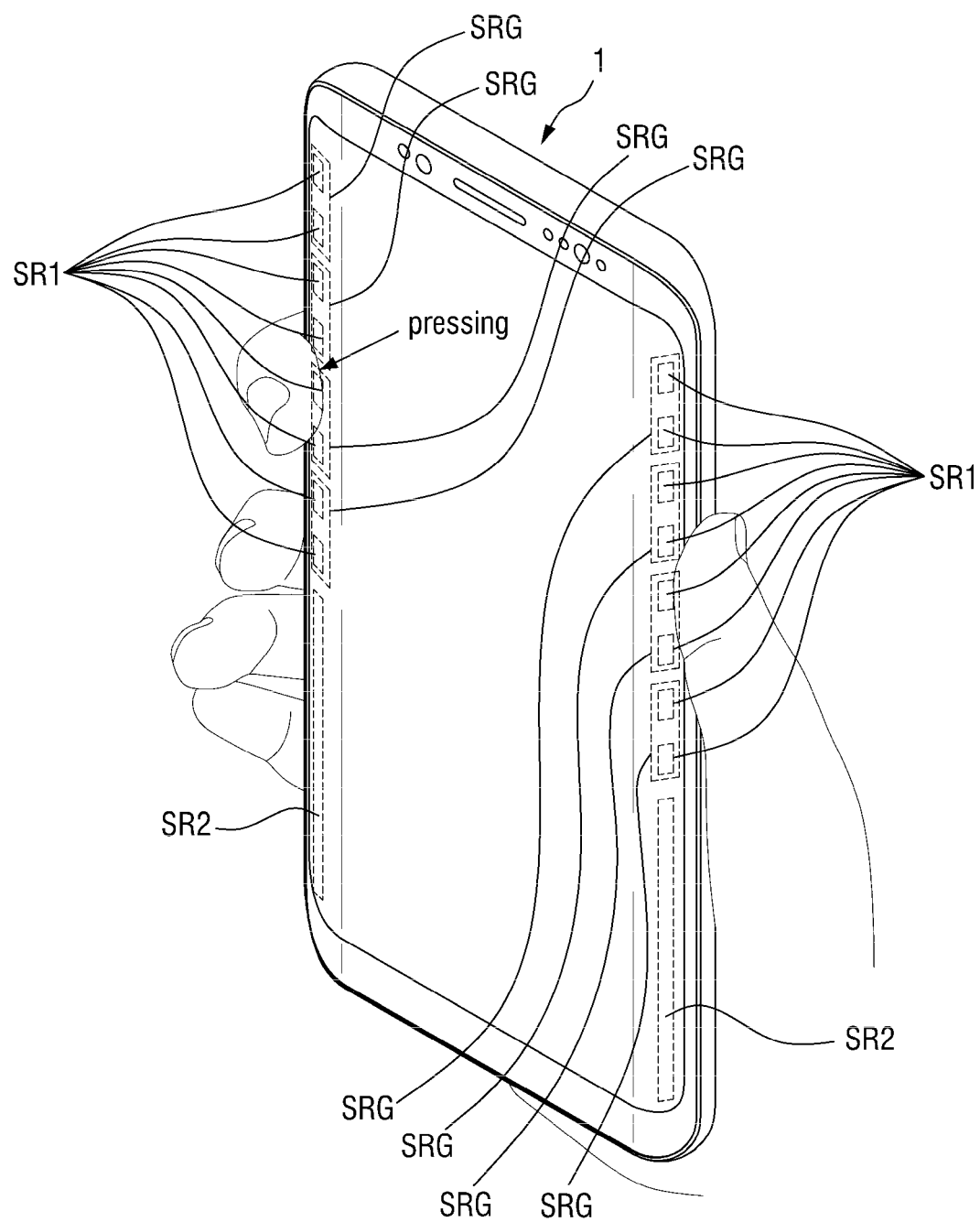
FIGS. 21A, 21B, and 21C are schematic views illustrating a method of applying a pressure signal to a display device according to an exemplary embodiment of the invention.
Figure 21B:
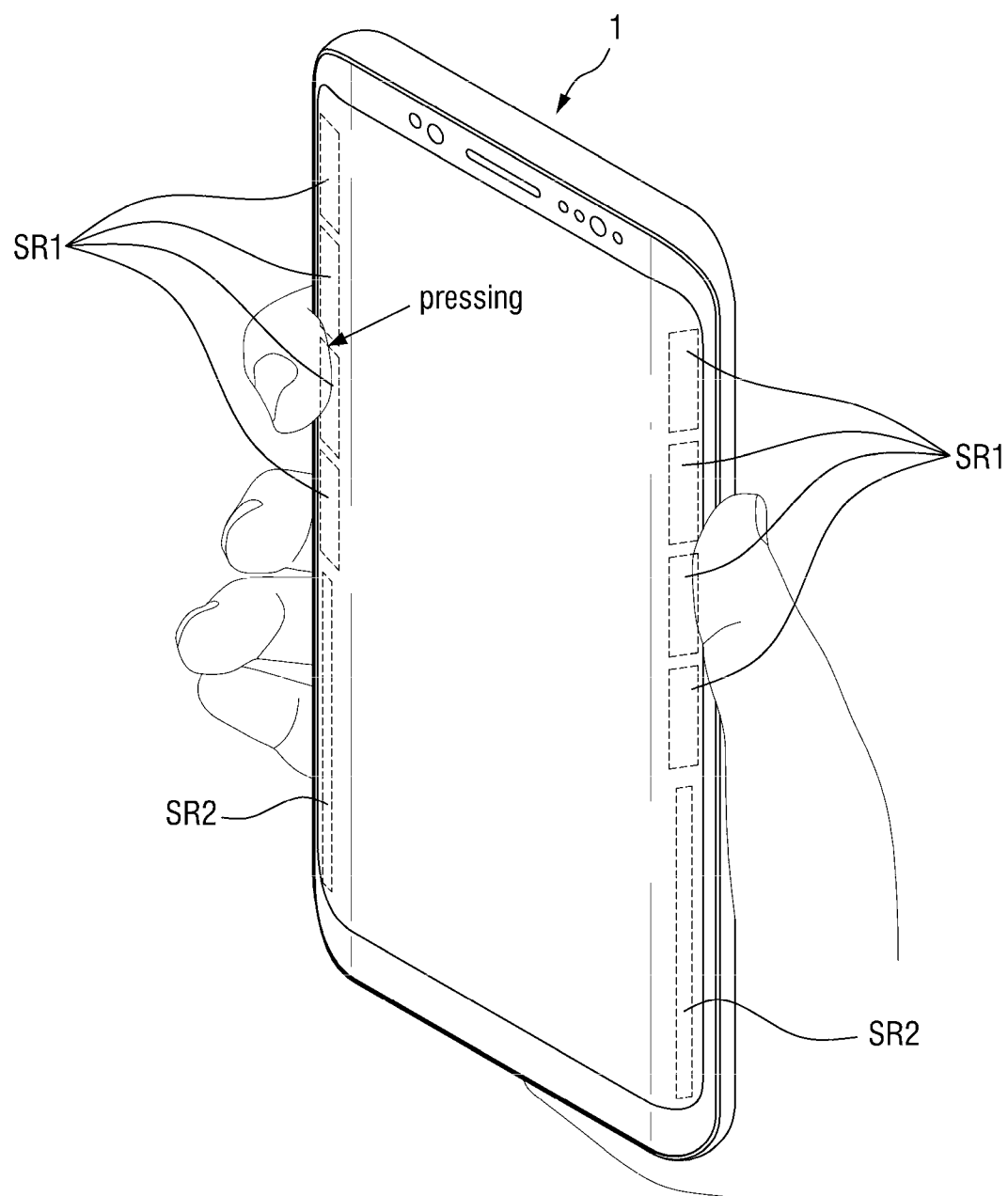
Figure 21C:
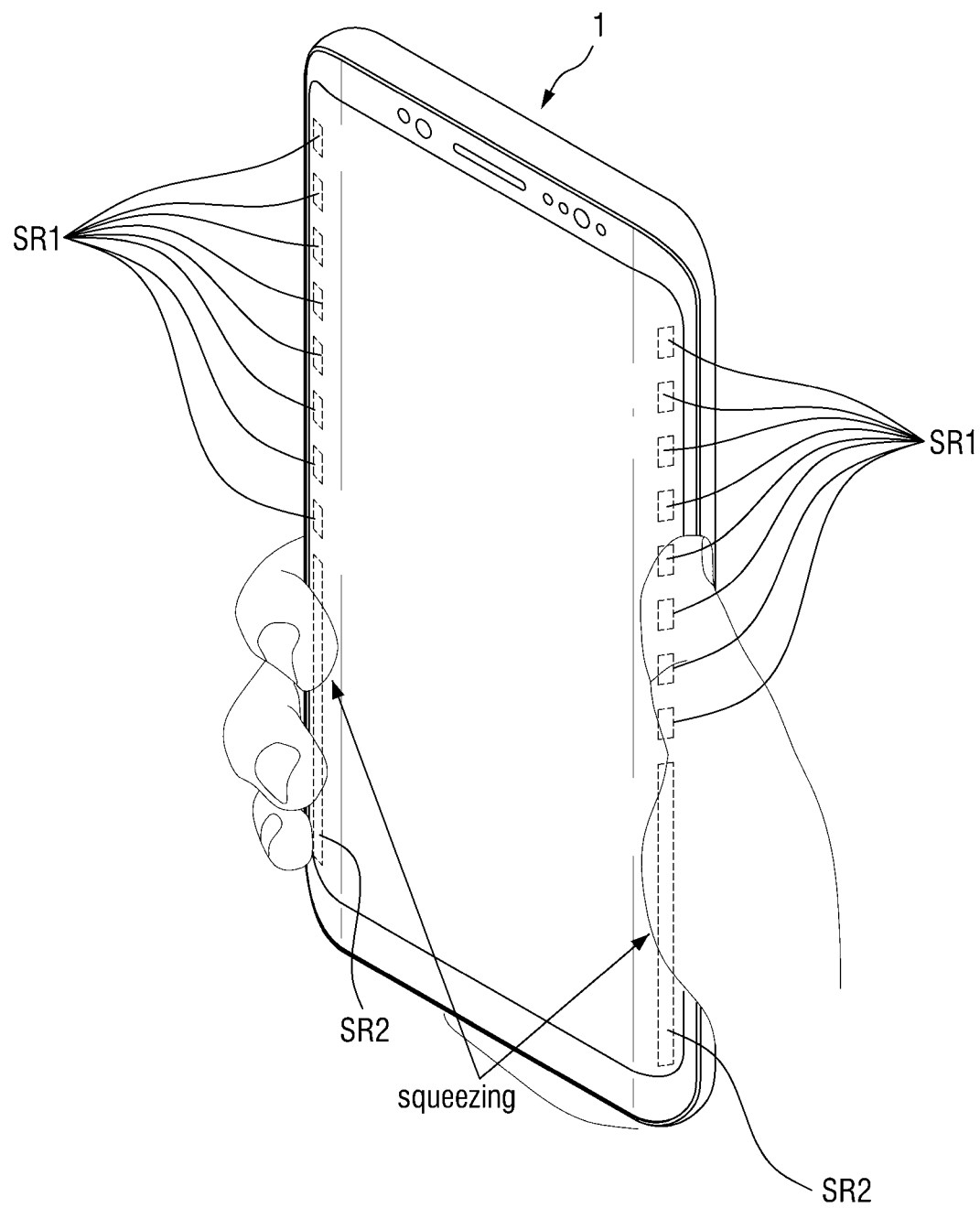

FIGS. 21A, 21B, and 21C are schematic views illustrating a method of applying a pressure signal to a display device according to an exemplary embodiment of the invention. FIGS. 21A, 21B, and 21C illustrate display devices employed by smart phones. In the display devices of FIGS. 21A, 21B, and 21C, physical input buttons, which are buttons that project outwardly from a surface of the display device, such as non-display portions of the front, back or side surfaces of the device and which are capable of being actuating by physical movement relative the surface, are eliminated on the longer sides, and instead pressure sensors are disposed there. In some exemplary embodiments, all the physical input buttons may be eliminated from the display device 1, and the pressure sensors may replace all of the physical input buttons.

The display device 1 may include sensing regions SR1 and SR2. The sensing regions SR1 and SR2 may be included in each of the first pressure sensor 100 and the second pressure sensor 200 (see FIG. 2). The sensing regions SR1 and SR2 sense a pressure and thus the sensing regions SR1 and SR2 may sense a pressure at the respective positions independently. The sensing regions SR1 and SR2 may be arranged in the longitudinal direction of the display device 1. In an exemplary embodiment, each of the sensing regions SR1 and SR2 may be arranged in a single column. The sensing regions SR1 and SR2 adjacent to each other may be arranged continuously or may be spaced apart from each other. That is, a non-sensing region may be disposed between the sensing regions SR1 and SR.

In FIGS. 21A and 21B, the first sensing region SR1 is used as a pressing-gesture recognition area. Specifically, FIGS. 21A and 21B show that a user grips the display device 1 with her/his fingers while pressing a position with the index finger. The first sensing regions SR1 of the pressure sensor 100 or 200 is disposed at the position. When the first sensing region SR1 is pressed, the resistance of the pressure sensing layers 122 and 222 (see FIG. 5) changes, which is sensed through the first and second electrodes TE1 and RE1 (see FIG. 8) to thereby determine whether a pressure is applied at that position and the magnitude of the pressure if so. A preprogrammed operation of the display device 1 may be output according to the pressure and/or its magnitude applied to the position. For example, pre-programmed functions may be performed, such as adjusting the screen, locking the screen, switching the screen, calling an application, running an application, capturing a picture, and receiving a phone call.

In some exemplary embodiments, different operations may be pre-programmed for different first sensing regions SR1. Therefore, the more the first sensing regions SR1 are, the easier it is for the display device 1 to make outputs.

When a user presses a position of the display device 1 with a finger, the contact area between the finger and the display device 1 may be larger than the area of the first sensing region SR1. In other words, in some exemplary embodiments, the area of the first sensing region SR1 may be set to be narrower than the contact area between the finger and the display device 1. When a user presses the position of the display device 1 with the finger, the pressure may be recognized in the two or more first sensing regions SR1. Then, as shown in FIG. 21A, a plurality of first sensing regions SR1 adjacent to each other may form a single sensing region group SRG, and the display device 1 may be programmed so that different operations are executed in response to an input generated in each of the sensing region group SRG. Although FIG. 21A shows that two adjacent first sensing regions SR1 form a group of sensing regions SRG, this is merely illustrative. Three or more first sensing regions may form each of the groups of sensing regions SRG.

Alternatively, as shown in FIG. 21B, when the area of the first sensing region SR1 is relatively wide, even if a user presses a position of the display device 1 with a finger, the pressure may be recognized in one sensing region SR1. For example, if a user presses the display device with a finger, the area of the first sensing region SR1 may be set to be substantially equal to or wider than the contact area between the finger and the display device 1. In this case, the neighboring first sensing regions SR1 may not form a group of sensing regions, and the display device 1 may be programmed to perform different operations in response to an input made in each of the first sensing regions SR1. However, the invention is not limited thereto. The display device 1 may be programmed such that the first sensing regions SR1 which are not adjacent to each other, e.g., the first sensing region SR1 located on the left side of the display device 1 and the second sensing region SR1 located on the right side of the display device 1 may allow the display device to perform the same operation.

The first sensing regions SR1 may have different areas depending on the positions. For example, when there are two first sensing regions SR1, the area of the first sensing region SR1 closer to the upper end of the display device 1 may be different from the area of the second sensing region SR2 closer to the second sensing region SR2.

FIG. 21C shows an example where the second sensing region SR2 is used as a squeezing gesture recognition area. Specifically, FIG. 21C shows that a user grips the display device 1 with her/his fingers while squeezing a relatively large area by using the palm and fingers. The second sensing region SR2 may be disposed in the area that is squeezed to thereby determine whether a pressure is applied by the squeezing gesture and the magnitude of the pressure if so. By doing so, a pre-programmed operation of the display device 1 may be performed.

The squeeze gesture can be performed by naturally applying pressure to the entire hand while gripping the display device 1. The squeezing gesture can be performed quickly without elaborately moving fingers while gripping the display device 1, and thus it is possible to more conveniently and quickly make inputs. Therefore, the second sensing region SR2 may be used as input means for frequently used features or a program that has to be run quickly such as snap shot.

In some exemplary embodiments, the display device 1 may perform a first operation when an input is made in the first sensing region SR1, and the display device 1 may perform a second operation when an input is made in the second sensing region SR2. That is, in some exemplary embodiments, the pre-programmed operation of the display device 1 associated with the first sensing region SR1 may be different from the pre-programmed operation of the display device 1 associated with the second sensing region SR1.

Figure 22A:
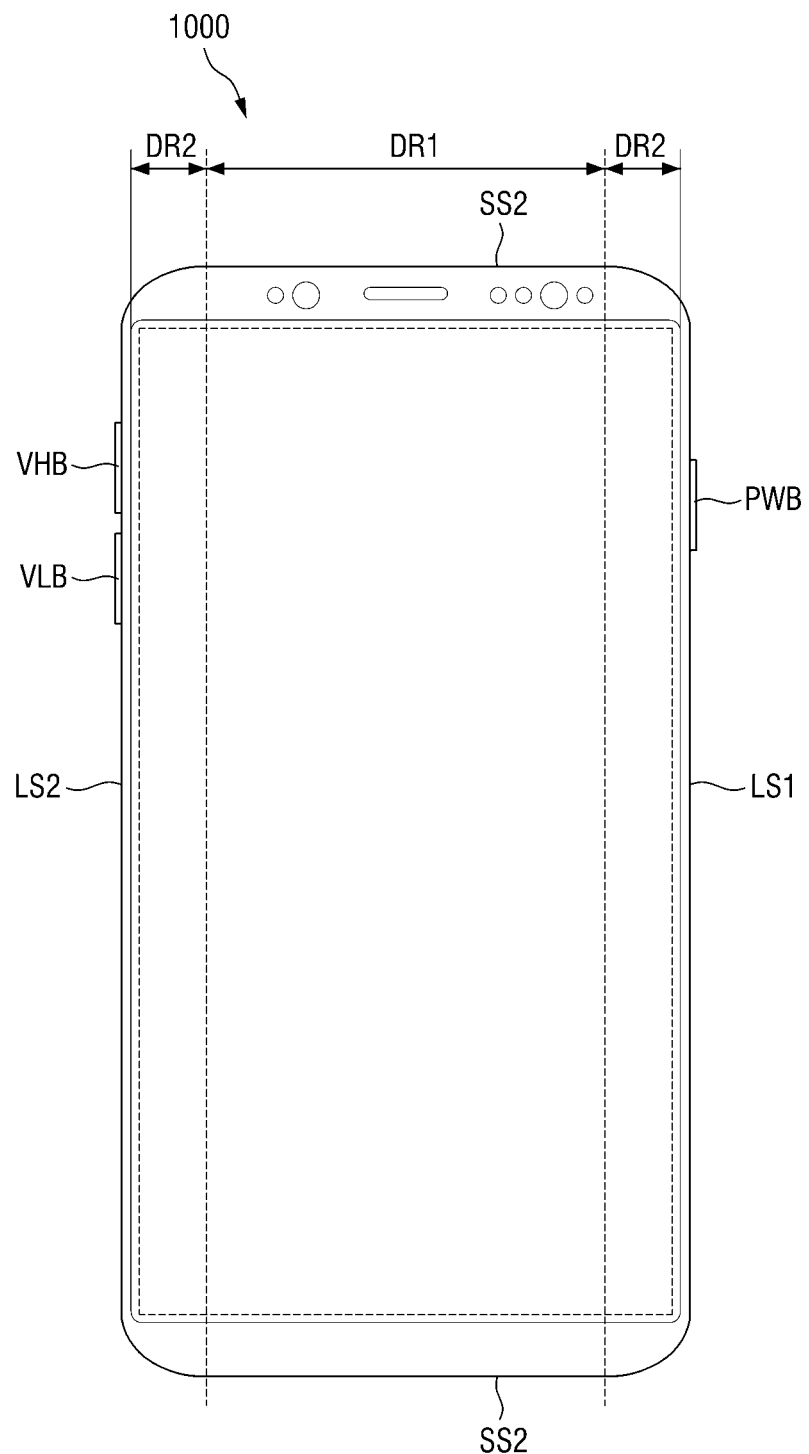
FIGS. 22A and 22B are plan views of display devices for illustrating a first pressure sensor and a second pressure sensor as substitutes for physical input buttons.
Figure 22B:
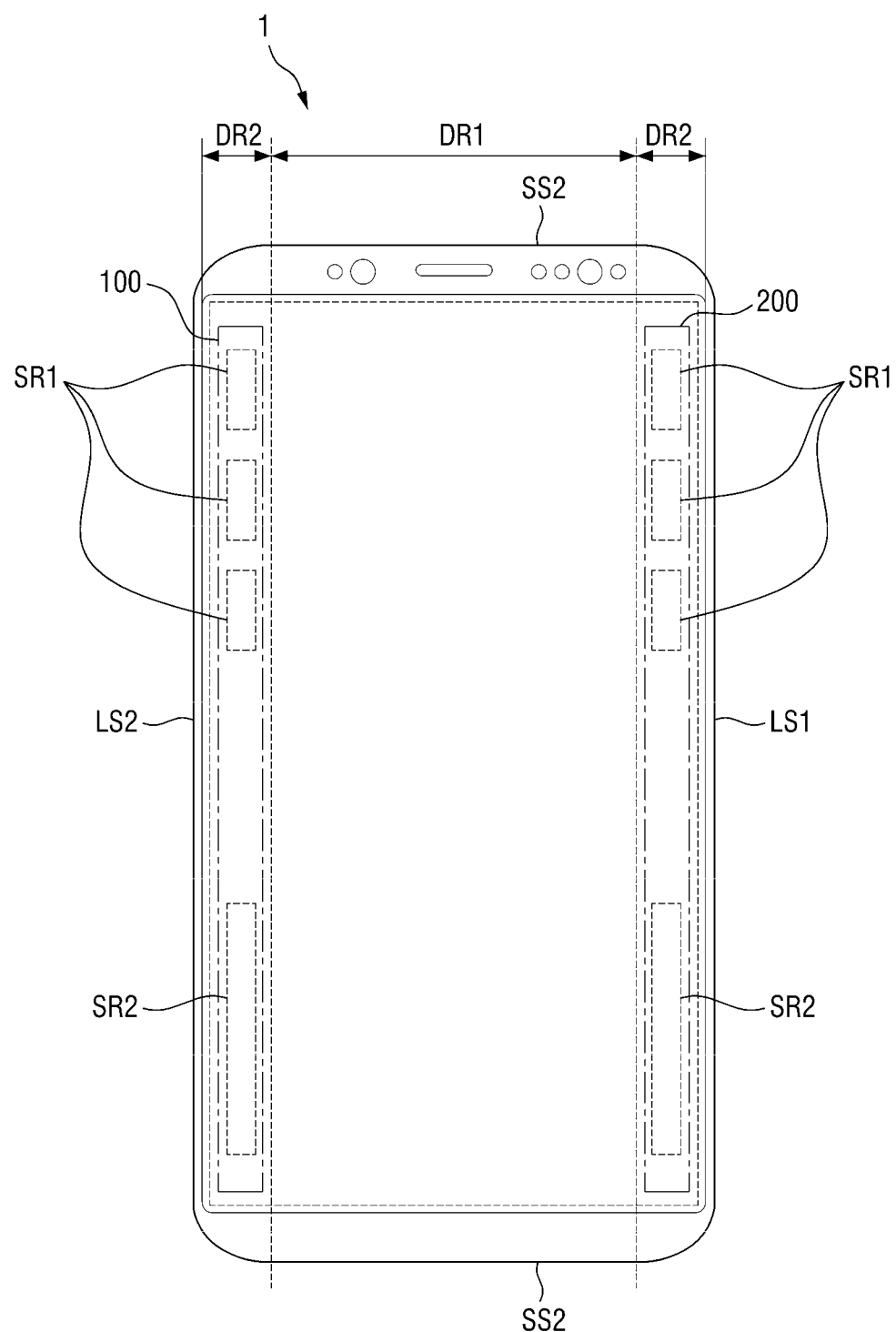

FIGS. 22A and 22B are plan views of display devices for illustrating a first pressure sensor and a second pressure sensor as substitutes for physical input buttons. FIG. 22A is a plan view of a display device including typical physical input buttons. FIG. 22B is a plan view of a display device including a first pressure sensor and a second pressure sensor.

Referring to FIG. 22A, a display device 1000 including physical input buttons may include a volume-up button VHB and a volume-down button VLB for adjusting the volume of sound output from the display device 1000 on the second longer side LS2 on the left hand. In FIG. 22A, the volume-up button VHB and the volume-down button VLB are physically separated from each other. In some implementations, however, the volume-up button VHB and the volume-down button VLB may be formed as a sing piece.

In addition, the display device 1000 including physical input buttons may further include a power button PWB for turning on/off the display device 1000 or switching the display device 1000 to the sleep mode on the first longer side LS1 on the right hand.

Further, the display device 1000 including the physical input buttons may further include an input button EXB programmed to perform a predetermined function on the second longer side LS2.

Besides, the display device 1000 may include various physical input buttons.

Referring to FIG. 22B, in some exemplary embodiments, the first pressure sensor 100 of the display device 1 may be disposed on the second longer side LS2 of the display device 1, and each of the first sensing regions SR1 of the first pressure sensor 100 may be located substantially at the same or similar positions as the volume-up button VHB, the volume-down button VLB, the input button EXB, etc., shown in FIG. 22A to replace them.

In addition, the second pressure sensor 200 of the display device 1 may be disposed on the first longer side LS1 of the display device 1, and one or more of the first sensing regions SR1 of the second pressure sensor 100 may be disposed at substantially the same or similar positions as the power button PWB shown in FIG. 22A to replace the power button PWB.

In some exemplary embodiments, all the physical input buttons may be eliminated from the display device 1, and the integrated pressure sensors may replace all of the physical input buttons. By doing so, the input means for receiving user inputs and the like are not exposed to the surface of the display device 1, thereby increasing the degree of design freedom and enhancing aesthetic quality.

In addition, the first pressure sensor 100 and the second pressure sensor 200 may be located on the two longer sides LS1 and LS2 of the display device 1 so that a user's fingers are naturally positioned when the user holds the display device 1. As a result, the user convenience of the display device 1 can be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel;
an input sensing panel disposed on a first surface of the display panel;
a display flexible circuit board to control the display panel having an input sensing driving circuit electrically connected to the input sensing panel, the display flexible circuit board being connected to the display panel; and
a first pressure sensor disposed on a second surface of the display panel, and adjacent to and extending along a first edge of the display panel, the second surface of the display panel being opposite to the first surface of the display panel; and
a first sensing flexible circuit board including a first end connected to the first pressure sensor and a second end connected to the display flexible circuit board,
wherein the first pressure sensor is electrically connected to the input sensing driving circuit of the display flexible circuit board.

2. The display device of claim 1, wherein the display panel comprises a flat portion and a first curved portion connected to one side of the flat portion, and
wherein the first pressure sensor overlaps with the first curved portion.

3. The display device of claim 2, further comprising:
the first sensing flexible circuit board connecting the first pressure sensor with the display flexible circuit board,
wherein the first pressure sensor is electrically connected to the input sensing driving circuit via the first sensing flexible circuit board.

4. The display device of claim 3, further comprising:
a second pressure sensor disposed adjacent to and extending along a second edge of the display panel,
wherein the second pressure sensor is electrically connected to the input sensing driving circuit of the display flexible circuit board.

5. The display device of claim 4, further comprising:
a second sensing flexible circuit board connecting the second pressure sensor with the display flexible circuit board.

6. The display device of claim 3, wherein the first sensing flexible circuit board is connected to one end of the first pressure sensor adjacent to the display flexible circuit board and extends along one side of the display panel adjacent to the display flexible circuit board.

7. The display device of claim 6, wherein the first sensing flexible circuit board is connected to a central portion of the first pressure sensor.

8. The display device of claim 7, wherein the first sensing flexible circuit board comprises:
a first pressure sensitive cell;
a second pressure sensitive cell;
a first sensing line connected to the first pressure sensitive cell;
a second sensing line connected to the second pressure sensitive cell; and
a driving line connected to the first pressure sensitive cell and the second pressure sensitive cell, and
wherein the driving line extends along the first edge via a non-sensing region between the first pressure sensitive cell and the second pressure sensitive cell.

9. The display device of claim 1, wherein the input sensing panel is disposed above the display panel, the display flexible circuit board being is disposed below the display panel, and
further comprising:
a frame disposed below the display panel and the display flexible circuit board; and
a main circuit board disposed under the frame,
wherein the frame includes a connect hole spaced from the main circuit board, and
wherein one end of the display flexible circuit board is connected to the main circuit board via the connect hole.

10. The display device of claim 9, wherein the first pressure sensor comprises a depression in an inner longer side thereof adjacent to the connect hole.

11. The display device of claim 1, wherein the first pressure sensor comprises:
a first base;
a second base facing the first base;
a first electrode disposed on a surface of the first base facing the second base;

a second electrode disposed on the surface of the first base and separated from the first electrode; and a pressure sensing layer disposed on a surface of the second base facing the first base, wherein the first electrode and the second electrode are configured to contact the pressure sensing layer in response to a pressure applied to the first edge of the display panel.

12. The display device of claim 11, wherein the first pressure sensor comprises a first pressure sensitive cell and a second pressure sensitive cell that sense a pressure independently, wherein the first electrode is disposed between the first pressure sensitive and to the second pressure sensitive cell, and wherein the second electrode is disposed in each of the first pressure sensitive cell and the second pressure sensitive cell.

13. The display device of claim 11, wherein the first electrode comprises a first stem electrode extending in a first direction and a plurality of first branch electrodes extending from the stem electrode, wherein the second electrode comprises a second stem electrode opposed to the first stem electrode and a plurality of second branch electrodes extending from the second stem electrode, and wherein the first branch electrodes and the second branch electrodes are arranged alternately between the first stem electrode and the second stem electrode.

14. The display device of claim 11, wherein the first pressure sensor further comprises a bump member disposed on another surface of the second base, and wherein the bump member overlaps with a part of a pressure sensitive layer.

15. The display device of claim 1, further comprising:

a second pressure sensor disposed adjacent to and extending along a second edge of the display panel, wherein the second pressure sensor is electrically connected to the input sensing driving circuit of the display flexible circuit board.

16. The display device of claim 15, further comprising:

a sensing flexible circuit board connecting the first pressure sensor, the second pressure sensor and the display flexible circuit board.

17. The display device of claim 16, wherein the sensing flexible circuit board comprises: a first projecting part extending in a first direction and extending the first pressure sensor and the second pressure sensor; and a second projecting part extending in a second direction from the first projecting part and connected to the display flexible circuit board, and wherein the second projecting part is closer to the first pressure sensor than to the second pressure sensor.

18. The display device of claim 17, wherein the sensing flexible circuit board comprises a first line connecting the first pressure sensor with the display flexible circuit board, and a second line connecting the second pressure sensor with the display flexible circuit board, and wherein a line width of the second line is different from a line width of the first line.

19. The display device of claim 1, wherein the first pressure sensor comprises a curved portion.

20. A display device comprising:

a display panel;

an input sensing panel disposed on a first surface of the display panel;

a touch flexible circuit board to control the input sensing panel and having an input sensing driving circuit electrically connected to the input sensing panel; and a first pressure sensor disposed on a second surface of the display panel, and adjacent to and extending along a first edge of the display panel, the second surface of the display panel being opposite to the first surface of the display panel, and a first sensing flexible circuit board including a first end connected to the first pressure sensor and a second end connected to the touch flexible circuit board, wherein the first pressure sensor is electrically connected to the input sensing driving circuit of the touch flexible circuit board.

21. The display device of claim 20, further comprising:

the first sensing flexible circuit board directly connecting the first pressure sensor with the touch flexible circuit board.

22. The display device of claim 20, further comprising:

a display flexible circuit board disposed between the display panel and the touch flexible circuit board and connected to the display panel; and the first sensing flexible circuit board connecting the first pressure sensor with the display flexible circuit board, wherein the display flexible circuit board electrically connects the first sensing flexible circuit board with the touch flexible circuit board.

23. The display device of claim 20, wherein the input sensing panel is disposed above the display panel, the touch flexible circuit board is disposed below the display panel.

* * * * *